United States Patent
Nishioka

(10) Patent No.: US 7,609,181 B2
(45) Date of Patent: Oct. 27, 2009

(54) SAMPLING FREQUENCY CONVERSION APPARATUS

(75) Inventor: Naotoshi Nishioka, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 88 days.

(21) Appl. No.: 12/009,736

(22) Filed: Jan. 22, 2008

(65) Prior Publication Data

US 2009/0002208 A1    Jan. 1, 2009

(30) Foreign Application Priority Data

Jan. 22, 2007    (JP) .............................. 2007-012076

(51) Int. Cl.
   *H03M 7/00*   (2006.01)
(52) U.S. Cl. ........................................ 341/61; 708/313
(58) Field of Classification Search ................. 341/61; 708/313
   See application file for complete search history.

(56) References Cited

U.S. PATENT DOCUMENTS

| | | | |
|---|---|---|---|
| 6,636,165 B2 * | 10/2003 | Freidhof | 341/61 |
| 6,889,239 B2 | 5/2005 | Akahori | |
| 7,061,409 B1 * | 6/2006 | Jantti et al. | 341/61 |

2006/0188052 A1    8/2006    Mochizuki et al.

FOREIGN PATENT DOCUMENTS

| JP | 2002-158561 | 5/2002 |
|---|---|---|
| JP | 2006238044 | 9/2006 |
| JP | 2006261812 | 9/2006 |

OTHER PUBLICATIONS

Japanese Patent Office: Office Action, "Notice of Reasons for Refusal" for Patent Application No. 2007-012076, dated Mar. 3, 2009, (4 pgs.).

* cited by examiner

*Primary Examiner*—Khai M Nguyen
(74) *Attorney, Agent, or Firm*—Pillsbury Winthrop Shaw Pittman LLP

(57) ABSTRACT

In a sampling frequency conversion apparatus, an input sample register stores a predetermined number of input samples as an original sequence of input samples for an interpolative operation. A coefficient generating part prepares a first sequence of interpolative coefficients corresponding to an oversampled sequence of input samples which are obtained by inserting nominal input samples of zero values to the input samples stored in the input sample register, and generates a second sequence of interpolative coefficients which are extracted from the first sequence of the interpolative coefficients and which correspond to the original sequence of the input samples. A convolutional operation part convolutes the second sequence of the interpolative coefficients with the original sequence of the input samples so as to output an interpolated sample.

6 Claims, 15 Drawing Sheets

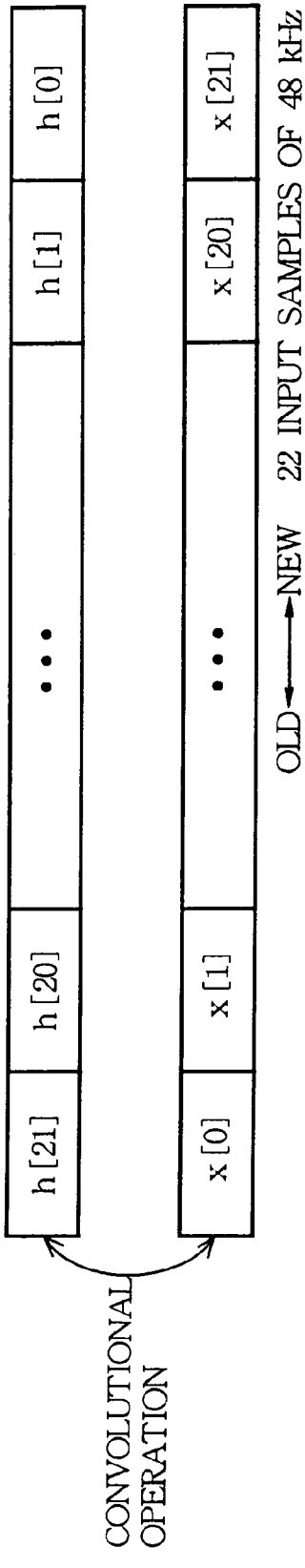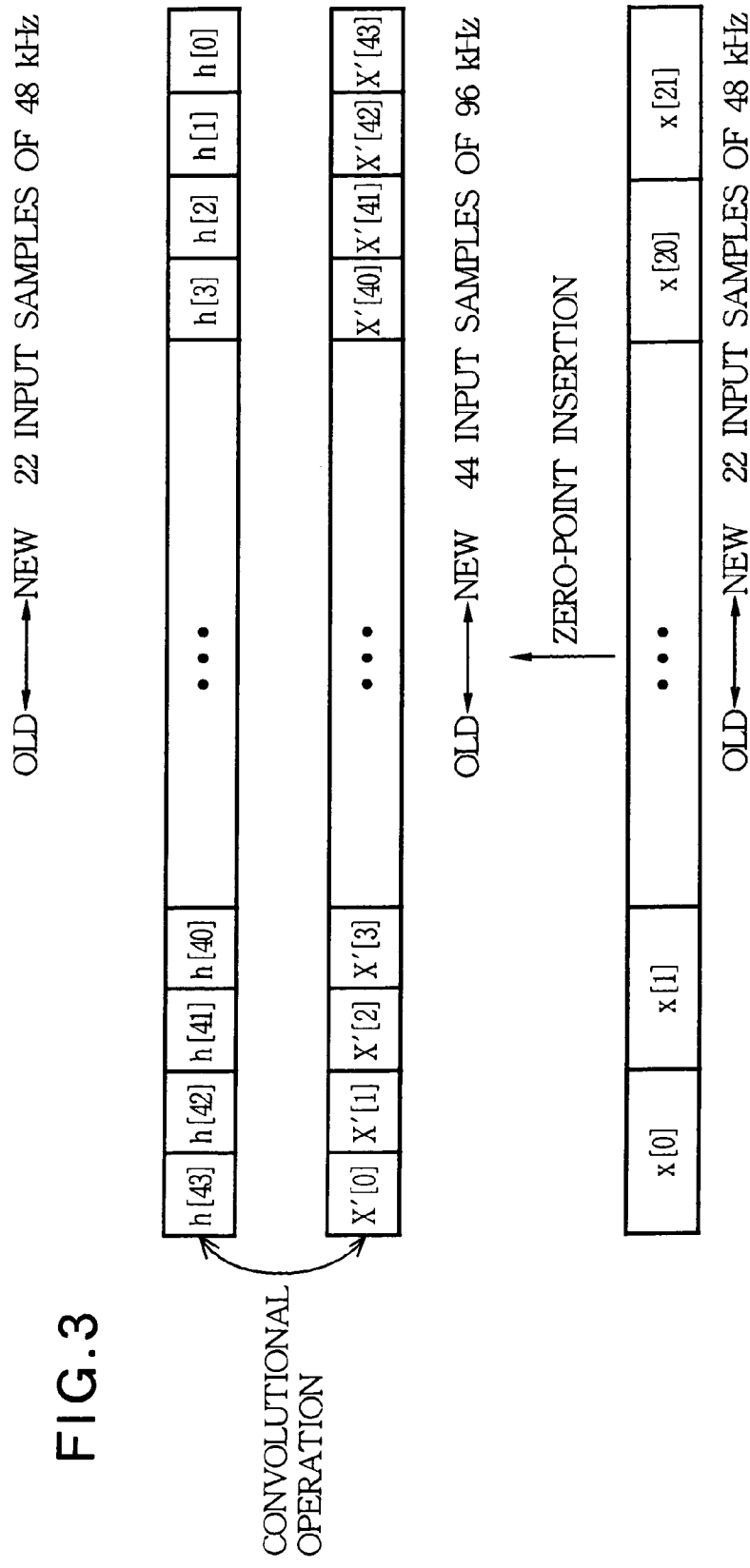
FIG.2
FIG.3

EVEN-NUMBERED INTERPOLATIVE COEFFICIENTES

ODD-NUMBERED INTERPOLATIVE COEFFICIENTES

● FUNCTION VALUE IN SAMPLING FUNCTION TABLE

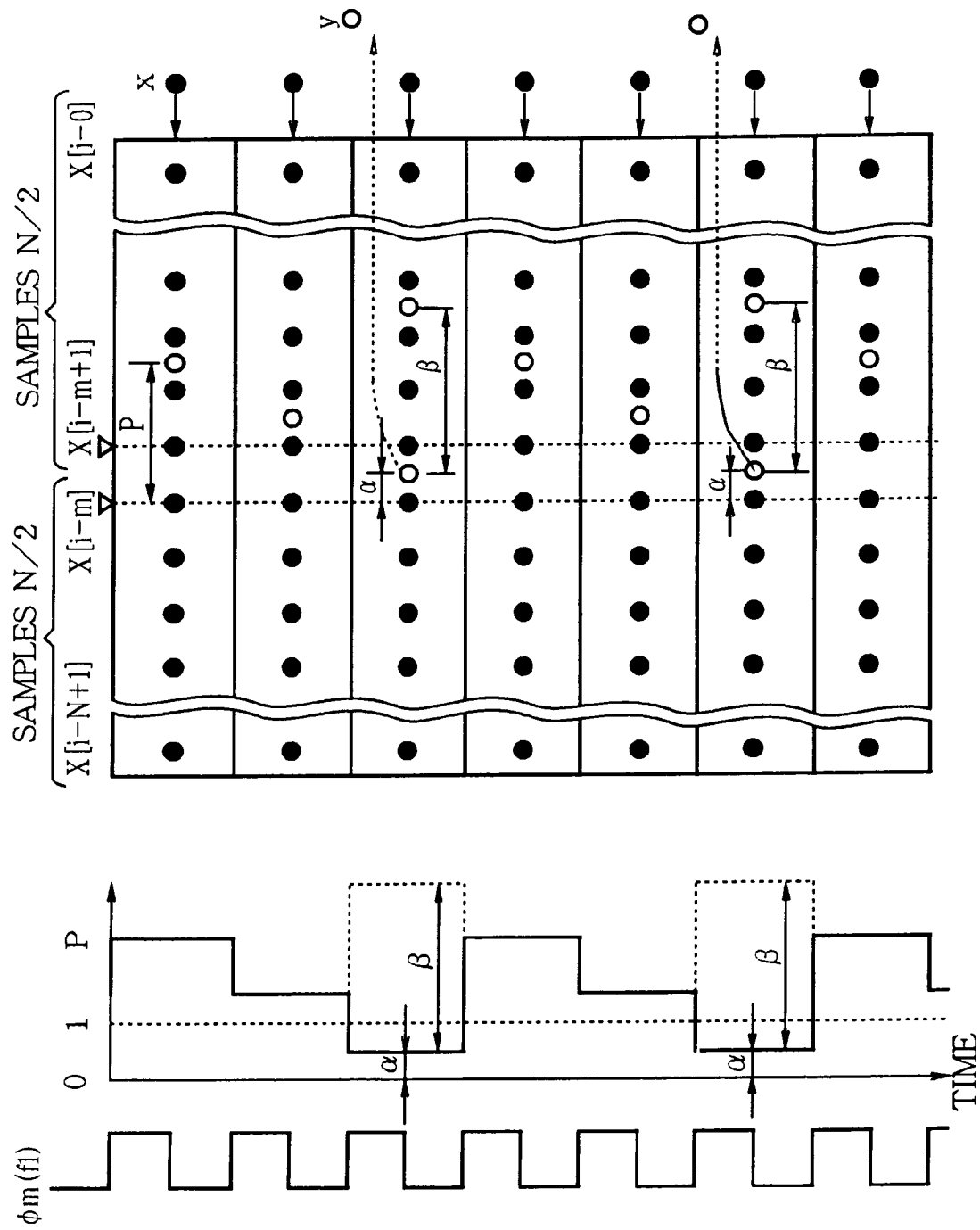

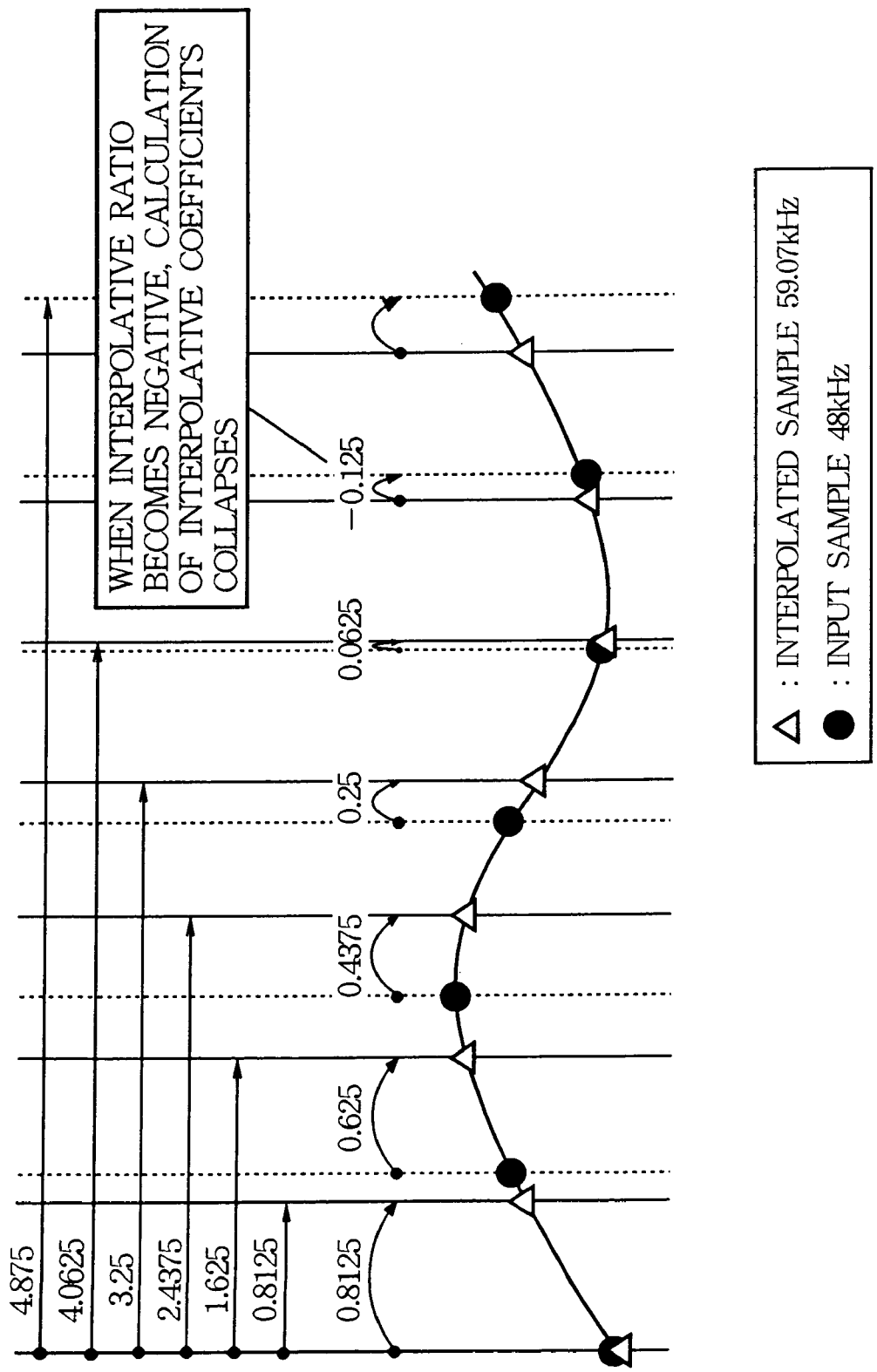

SAMPLING FREQUENCY CONVERSION APPARATUS

BACKGROUND OF THE INVENTION

1. Technical Field

The present invention relates to a sampling frequency conversion apparatus preferable for digital audio equipment or the like.

2. Background Art

In the field of digital audios or the like, since devices supporting various sampling frequencies are provided, devices that are different from each other in terms of the sampling frequency are often connected to each other. In this case, a sampling frequency conversion apparatus is interposed between a preceding device and a succeeding device for converting an input sampling frequency of input samples such as audio samples which are fed from the preceding device to an output sampling frequency which is specified by the succeeding device.

A known sampling frequency conversion apparatus applies an interpolative operation to input samples having the input sampling frequency so as to compute interpolated samples having the output sampling frequency which is specified by the succeeding device, and outs the interpolated samples to the succeeding device. Incidentally, as a literature concerning such a type of the sampling frequency conversion apparatus, there are, for example, patent documents 1 and 2.

[Patent Document 1] JP-A-2006-238044
[Patent Document 2] JP-A-2006-261812

However, in case that the output sampling frequency requested by the succeeding device is equal to or greater than the input sampling frequency of the input samples, the conventional sampling frequency conversion apparatus occasionally fails to convert the sampling frequency due to occurrence of errors in the interpolative operation. Even in case that the output sampling frequency requested by the succeeding device is smaller than the input sampling frequency of the input samples, the conventional sampling frequency conversion apparatus may fail to convert the sampling frequency due to occurrence of jitter of the sampling frequencies.

SUMMARY OF THE INVENTION

The present invention is contrived in consideration of the foregoing situation. An object of the present invention is to provide a sampling frequency conversion apparatus capable of, even if a sampling frequency requested by a succeeding device is equal to or larger than a sampling frequency of input samples, converting the input sampling frequency to the output sampling frequency, which is requested by the succeeding device, without occurrence of an error in an interpolative operation.

The present invention provides a sampling frequency conversion apparatus for applying an interpolative operation to input samples having an input sampling frequency so as to compute interpolated samples having an output sampling frequency which is specified by a succeeding device, and for outputting the interpolated samples to the succeeding device. The inventive sampling frequency conversion apparatus comprises: an input sample register that stores a predetermined number of input samples as an original sequence of input samples for the interpolative operation; a coefficient generating part that prepares a first sequence of interpolative coefficients corresponding to an oversampled sequence of input samples which are obtained by inserting nominal input samples of zero values to the input samples stored in the input sample register, and that generates a second sequence of interpolative coefficients which are extracted from the first sequence of the interpolative coefficients and which correspond to the original sequence of the input samples; and a convolutional operation part that convolutes the second sequence of the interpolative coefficients with the original sequence of the input samples so as to output the interpolated sample.

According to the present invention, the sampling frequency conversion apparatus can perform the sampling frequency conversion which achieves efficient results equivalent to the case where the interpolative computation process is performed with the oversampling of the input samples by inserting zero samples, without increasing a computation amount per one interpolated sample. Consequently, not only when the output sampling frequency specified by the succeeding device is less than the input sampling frequency of the input samples, but also when the output sampling frequency specified by the succeeding device is equal to or greater than the input sampling frequency of the input samples, the sampling frequency conversion can be performed without occurrence of an error in an interpolative operation and without increasing the computation amount per one interpolated sample.

BRIEF DESCRIPTION OF THE DRAWINGS

FIG. 2 is a diagram for explaining the contents of processing of an interpolative operation performed by a basic sampling frequency conversion apparatus.

FIG. 3 is a diagram for explaining the contents of processing of an interpolative operation accompanied by double over-sampling based on zero point insertion.

FIG. 17 is a diagram for explaining updating process of phase information performed in the basic sampling frequency conversion apparatus.

FIG. 18 is a diagram for explaining an error in an interpolative operation occurring in the basic sampling frequency conversion apparatus.

DETAILED DESCRIPTION OF THE INVENTION

Figure 12:
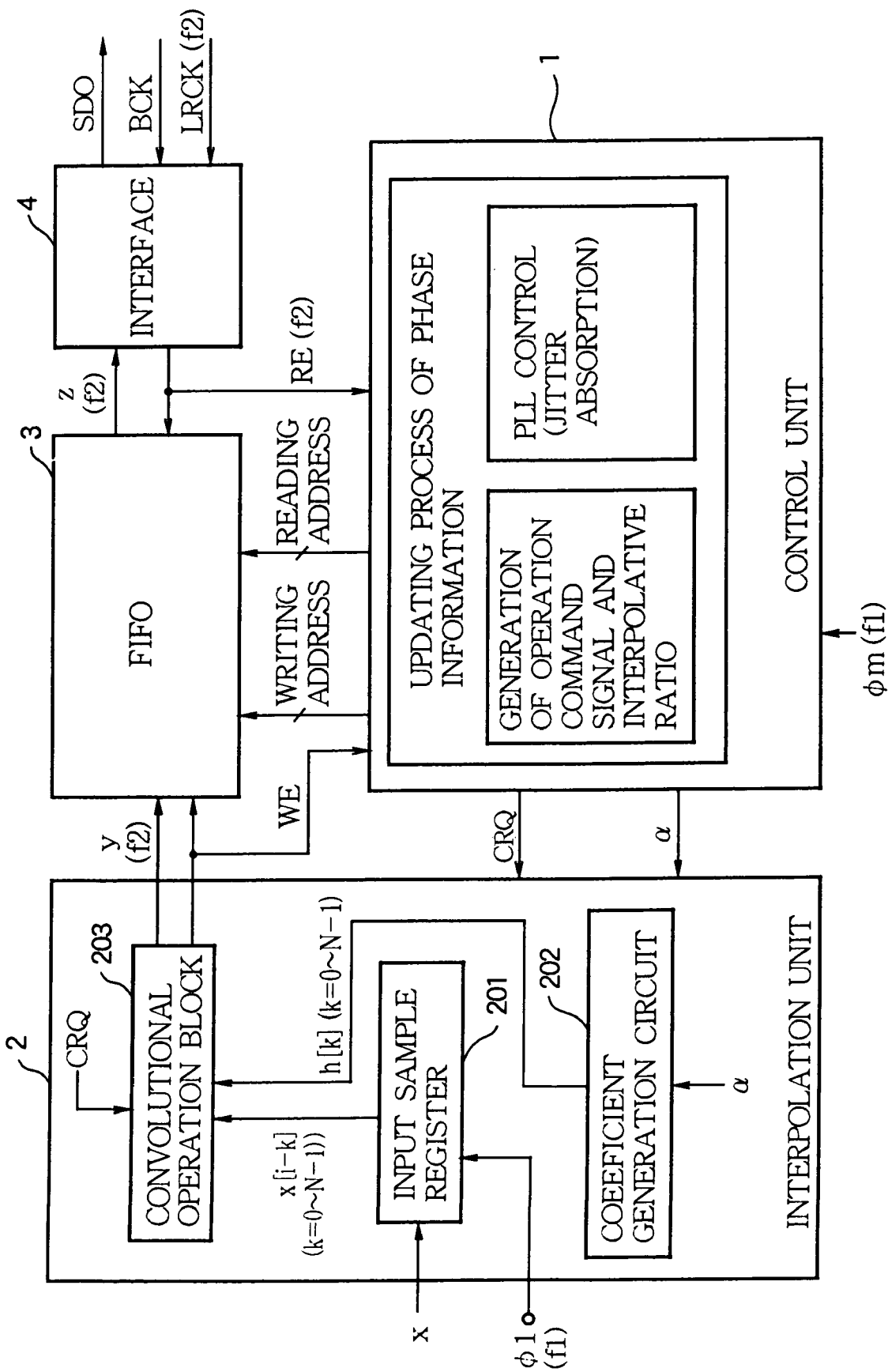
FIG. 12 is a block diagram showing the configuration of a basic sampling frequency conversion apparatus.

FIG. 12 is a block diagram showing an example of the configuration of a basic type of a sampling frequency conversion apparatus. The basic sampling frequency conversion apparatus is a device that performs an interpolative operation on samples x of a first sampling frequency f1 (input sampling frequency) outputted from the device in the preceding stage, thus converts the samples x into interpolated samples y of a second sampling frequency f2 (output sampling frequency) which the device in the succeeding stage requests, and outputs the samples y.

As shown in FIG. 12, the sampling frequency conversion apparatus includes a control unit 1 that controls the whole of the apparatus, an interpolation unit 2, a first-in first-out (FIFO) 3 formed with a RAM or the like, and an interface 4.

To the interpolation unit 2, the input samples x of the first sampling frequency f1 are fed from the device in a stage preceding the sampling frequency conversion apparatus. The interpolation unit 2 performs an interpolative operation on a sequence of a predetermined number of input samples x, which have been inputted previously, under the control of the control unit 1, thus generates interpolated samples y of the second sampling frequency f2 which the succeeding device requests, and outputs the interpolated samples y together with a writing request signal WE. The control unit 1 updates a writing address, which is fed to the FIFO 3, responsively to the output of the writing request signal WE.

The FIFO 3 is a first-in first-out buffer that sequentially stores the interpolated samples y, which are fed from the interpolation unit 2 together with the writing request signal WE, under the control of the control unit 1, that reads out the stored samples y sequentially from oldest ones responsively to a reading request signal RE from the interface 4, and that feeds the samples y as a sequence of interpolated samples z to the interface 4.

The interface 4 outputs the reading request signal RE to each of the FIFO 3 and the control unit 1 according to a word clock LRCK sent from the device in the succeeding stage. In response to the reading request signal RE, the control unit 1 updates a reading address fed to the FIFO 3, and extends control so that the oldest one of the interpolated samples y that have not been read will be outputted from the FIFO 3. The interface 4 receives the samples z read from the FIFO 3 responsively to the output of the reading request signal RE to the control unit 1. The interface 4 then converts the received samples z into a serial bit string SDO, and outputs the bit string SDO synchronously with a bit clock BCK fed from the device in the succeeding stage. The word clock LRCK is a clock having the same frequency as the second sampling frequency f2 requested by the device in the succeeding stage.

Figure 13:
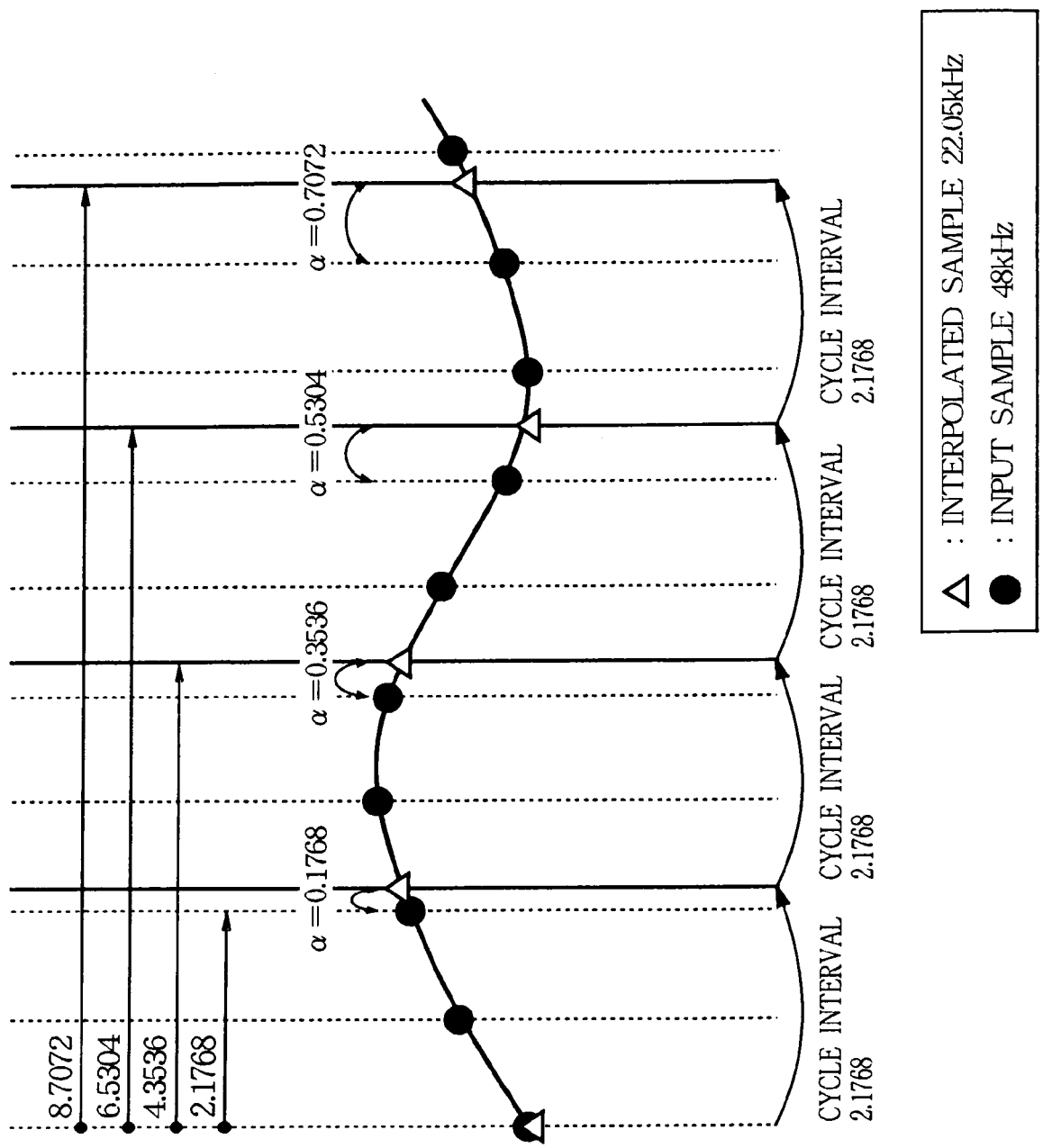
FIG. 13 is a diagram showing an example of operation of the basic sampling frequency conversion apparatus.

FIG. 13 shows the contents of an interpolative operation performed by the interpolation unit 2. In FIG. 13, black-circle marks indicate the input samples x fed to the interpolation unit 2, and void-triangle marks indicate the interpolated samples y to be generated by the interpolation unit 2. Assuming that a ratio $(1/f2)/(1/f1)=f1/f2$ obtained by dividing the cycle $1/f2$ of the interpolated samples y to be generated by the cycle (time interval between samples) $1/f1$ of the input samples x is regarded as a conversional ratio $\beta$, the interpolated samples y to be generated through an interpolative operation are those obtained by re-sampling a wave, which is expressed by the input samples x, at intervals of a $\beta$ cycle (one cycle=$1/f1$). In the example shown in FIG. 13, the first sampling frequency f1 is 48 kHz, and the second sampling frequency f2 is 22.05 kHz. Therefore, the conversional ratio $\beta$ comes to 48 kHz/22.05 kHz=2.1768. Consequently, the interpolated samples y are those obtained by re-sampling the wave, which is expressed by the input samples x, at intervals of a cycle of 2.1768.

In order to perform the interpolative operation, the interpolation unit 2 includes, as shown in FIG. 12, an input sample register 201, a coefficient generation circuit 202, and a convolutional operation block 203. Herein, the input sample register 201 is a shift register of, for example, N steps (where N denotes a predetermined integer). The input samples x of the first sampling frequency f1 are sequentially fetched with a clock $\phi1$ having the same frequency as the first sampling frequency f1. A sample string $x[i-k]$ of N fetched previous samples (k=0 to N−1 where i denotes an index associated with a time instant, $x[i-0]$ denotes the latest sample, and $x[i-(N-1)]$ denotes the oldest sample) is held as an interpolative-operation input sample string.

Every time the clock $\phi1$ is fed to the input sample register 201, the latest sample x is written in the input sample register 201, and the oldest sample stored in the input sample register 201 is discarded. Consequently, the interpolative-operation input sample string $x[i-k]$ (k=0 to N−1) to be inputted to the input sample register 201 is updated to the one, of which phases lead by one sampling cycle $1/f1$, with every elapse of one sampling cycle $1/f1$.

When the phases of the interpolative-operation input sample string $x[i-k]$ (k=0 to N−1) in the input sample register 201 become suitable for an interpolative operation for the interpolated samples y, an operation request signal CRQ requesting the interpolative operation and an interpolative ratio $\alpha$ are fed from the control unit 1. Herein, the interpolative ratio $\alpha$ refers to the phases at sampling points of the interpolated samples y to be generated by the interpolation unit 2.

To be more specific, in the sampling frequency conversion apparatus, when a state in which an interpolated sample y exists between a sample $x[i-m]$ (for example, m=N/2) out of the interpolative-operation input sample string $x[i-k]$ (k=0 to N−1), which is held in the input sample register 201, and a sample $x[i-m+1]$ is established, the interpolation unit 2 obtains the interpolated sample y by performing the interpolative operation. The interpolative ratio $\alpha$ signifies at what position on a time base between the sampling point for the sample $x[i-m]$ and the sampling point for the sample $x[i-m+i]$ the sampling point for the interpolated sample y that should be obtained through the interpolative operation is located. Specifically, the interpolative ratio $\alpha$ signifies that the sampling point for the interpolated sample y is located to lead the sampling point for the sample $x[i-m]$ in the input sample register 201 by an $\alpha$ cycle (one cycle is $1/f1$).

The coefficient generation circuit 202 is a circuit that outputs an interpolative coefficient string $h[k]$ (k=0 to N−1) associated with the interpolative ratio $\alpha$. The convolutional operation block 203 is a circuit that performs a convolutional operation using the interpolative coefficient string h [k] (k=0 to N−1) and the interpolative-operation input sample string x[i−k] (k=0 to N−1) stored in the input sample register 201 responsively to the feed of the operation request signal CRQ and that outputs an interpolative sample y.

Figure 14:
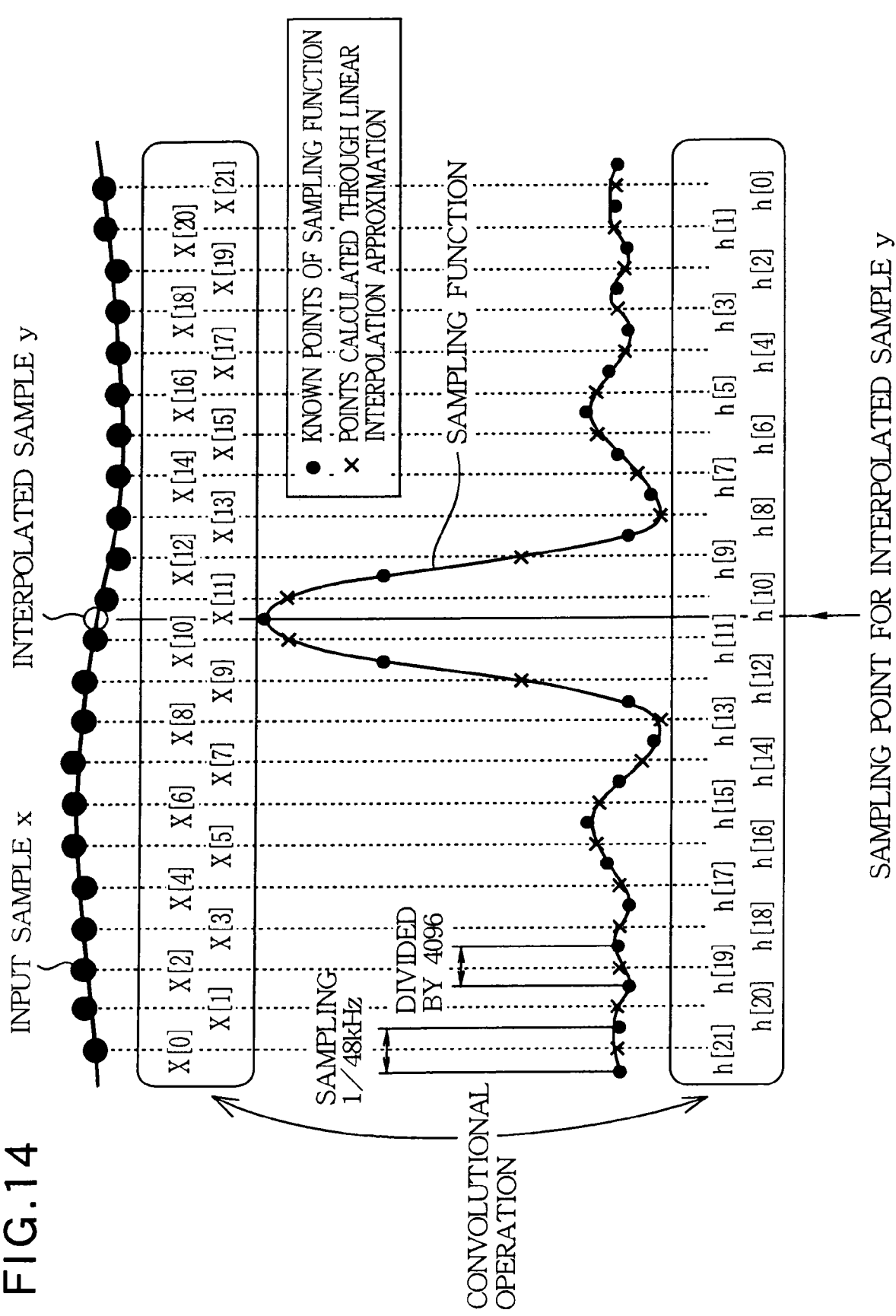
FIG. 14 is a diagram for explaining a method of generating interpolative coefficients in the basic sampling frequency conversion apparatus.
Figure 15:
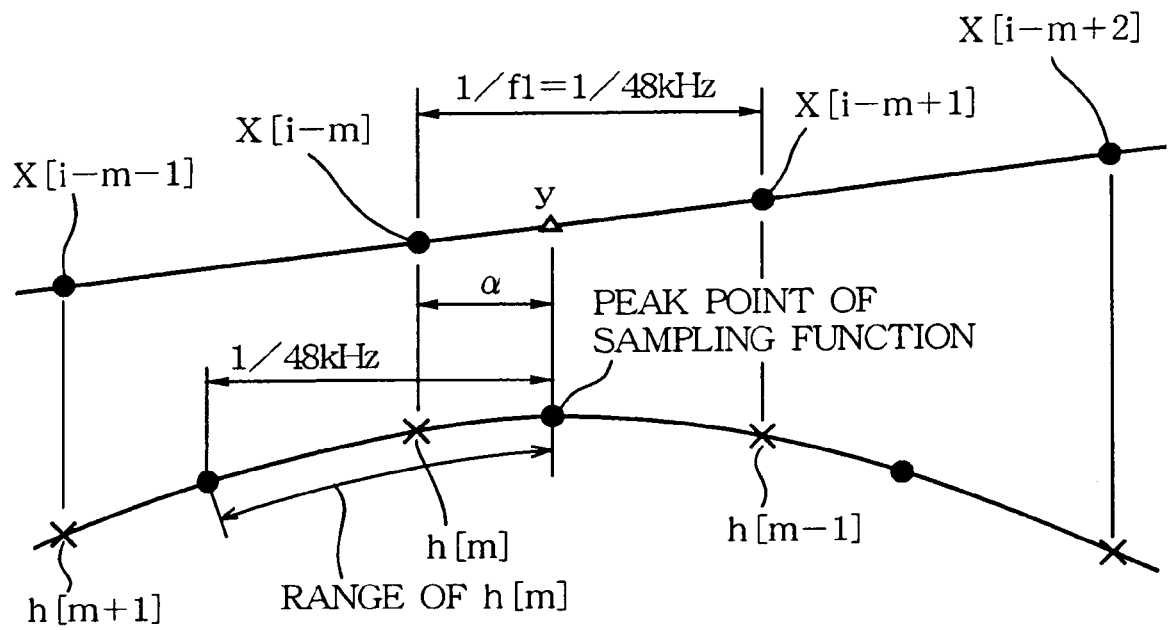
FIG. 15 is a diagram for explaining in detail a method of generating interpolative coefficients in the basic sampling frequency conversion apparatus.
Figure 16:
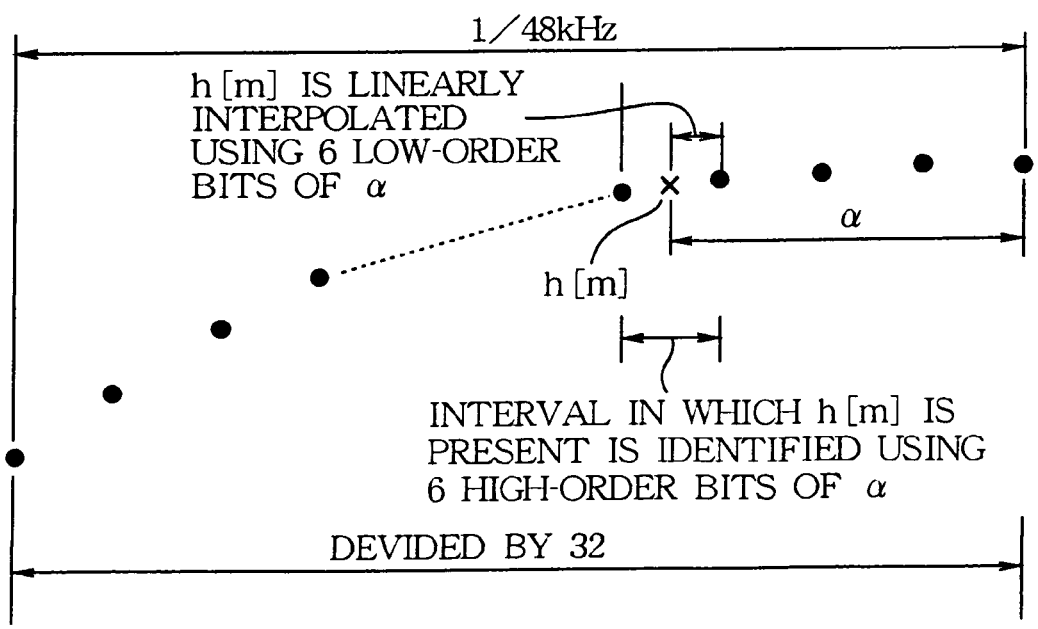
FIG. 16 is a diagram showing a method of identifying an interval, in which interpolative coefficients are present, and a linear interpolation method for the interpolative coefficients in the basic sampling frequency conversion apparatus.

FIG. 14 to FIG. 16 are diagrams for explaining a method of generating the interpolative coefficient string h[k] (k=0 to N−1), which is implemented in the coefficient generation circuit 202, by taking for instance a case where a 22nd-order interpolative operation is performed. The coefficient generation circuit 202 has a sampling function table, which lists function values at a plurality of points of a sampling function that is an impulse response of an ideal low-pass filter, stored therein (FIG. 14 shows part of the points as "points of a known sampling function"). When a peak point of the sampling function is, as shown in FIG. 14 and FIG. 15, squared with a sampling point for an interpolated sample y, the coefficient generation circuit 202 calculates as interpolative coefficients h[k] (k=1 to N−1) function values of points of the sampling function which have the same phases as the samples of the interpolative-operation input sample string x[i−k] (k=0 to N−1) stored in the input sample register 201. As also shown in FIG. 15, the interpolative coefficients h[k] (k=1 to N−1), in the sampling function, include an interpolative coefficient h[m] that is a function value at a point moved from the peak point to a negative side by a time equivalent to the interpolative ratio α, and N−1 interpolative coefficients h[k] (k=0 to m−1, m+1 to N−1) that are function values of points of the sampling function juxtaposed with the position of the interpolative coefficient h[m] as a center while being interspaced by 1/48 kHz.

Assuming that the interpolative ratio α is, for example, data represented by 12 bits, a time resolution for the sampling points of the interpolated samples y determined with the interpolative ratio α is a quotient of a period of 1/48 kHz divided by 4096. In this case, in order to generate the interpolative coefficients h[k] (k=1 to N−1) according to all values the interpolative ratio α can assume, the ability to generate 4096 sampling function values per an interpolative coefficient h[k] is requested. However, if the sampling function values were listed in the sampling function table, a memory capacity required to store the values in the sampling function table would be enormous. This is not advantageous. In general, therefore, as described below, the interpolative coefficients h[k] (k=0 to N−1) are calculated according to a method that employs both reference to the sampling function table and linear interpolation.

FIG. 16 is a diagram for explaining the calculating method by taking an interpolative coefficient h[m] for instance. As shown in FIG. 16, one interpolative coefficient h[m] would assume any of sampling function values within an interval of 1/48 kHz. Consequently, thirty-two sampling function values by which the interval of 1/48 kHz is divided into 32 intervals are listed per one interpolative coefficient h[m] in the sampling function table.

For calculation of the interpolative coefficient h[m], first, in whichever of the thirty-two intervals the interpolative coefficient h[m] to be obtained is present is identified based on six high-order bits of the 12-bit interpolative ratio α. Two sampling function values at both limits of the identified interval are read from the sampling function table. Thereafter, based on the six low-order bits of the 12-bit interpolative ratio α, linear interpolation is performed using the two read sampling function values in order to calculate the interpolative coefficient h[m].

Next, the contents of processing to be performed by the control unit 1 will be described below. One of pieces of processing to be performed by the control unit 1 is updating process of phase information P. The phase information P is information signifying the phase relationship between a sampling point for an interpolated sample y to be generated next and the interpolative-operation input sample string x[i−k] (k=0 to N−1) in the input sample register 201. As mentioned above, the contents of the interpolative-operation input sample string x[i−k] (k=0 to N−1) are updated synchronously with the clock φ1 having the same frequency as the first sampling frequency f1. The control unit 1 therefore executes the updating process of the phase information P synchronously with a clock φm having the same frequency as the first sampling frequency f1. The aforesaid operation request signal CRQ and interpolative ratio α are generated in the process of the updating process of the position information P.

FIG. 17 is a diagram showing the process of the updating process of the phase information P to be performed by the control unit 1. In the drawing, an up-and-down direction is a time base. FIG. 17 shows a scene where the phase information P is updated synchronously with the clock φm. Moreover, for a better understanding of a scene where the phase relationship between an interpolated sample y and the interpolative-operation input sample string x[i−k] (k=0 to N−1) changes according to the clock φm, the input sample string interpolative-operation input sample string x[i−k] (k=0 to N−1) stored in the input sample register 201 is indicated with black-circle marks, and the positions of the interpolated samples y are indicated with void-circle marks.

The phase information P is information signifying to what extent the phase of an interpolated sample y to be generated next leads the phase of a sample x[i−m] (for example, m=N/2) out of the interpolative-operation input sample string x[i−k] (k=0 to N−1). Specifically, the phase information P signifies that the phase of the interpolated sample y to be generated next is located to lead the phase of the sample x[i−m] at a current time point i by a P cycle (one cycle equals 1/f1).

The control unit 1 decrements the phase information P by 1 along with every rise of the clock φm. This is because that the phases of the interpolative-operation input sample string x[i−k] (k=0 to N−1) lead by one cycle (=1/f1) along with every rise of the clock φm.

When the phase information P is decremented by 1 synchronously with the clock φm, the phase information P duty gets smaller than 1. At this time, the sampling point for an interpolated sample y is located between a sample x[i−m] (in the illustrated example, m=N/2) out of the interpolative-operation input sample string x[i−k] (k=0 to N−1) and a sampling point for a sample x[i−m+1]. The control unit 1 sends the operation request signal CRQ to the interpolation unit 2, and sends a decimal part of the phase information P as the interpolative ratio α to the interpolation unit 2. This causes the interpolation unit 2 to generate the interpolative coefficient string h[k] (k=0 to N−1) associated with the interpolative ratio α according to the aforesaid method. The interpolative coefficient string is convoluted to the interpolative-operation input sample string x[i−k] (k=0 to N−1), whereby the interpolated sample y is generated.

On the other hand, the control unit 1 that has outputted the operation request signal CRQ and interpolative ratio α updates the phase information P so that the contents will signify the phase of an interpolated sample y to be generated next. Specifically, a conversional ratio β=f1/f2 is added to the phase information P. Thereafter, the phase information P is decremented by 1 along with every rise of the clock φm. When the phase information P gets smaller than 1, the operation request signal CRQ and interpolative ratio α are fed to the interpolation unit 2, and the conversional ratio β is added to the phase information P.

As a result of repetition of the foregoing processing, the operation request signal CRQ and interpolative ratio α are sent to the interpolation unit 2 at a temporal density inversely proportional to the conversional ratio β. As shown in FIG. 13, the interpolated samples y juxtaposed while being interspaced by a β cycle are sequentially generated by the interpolation unit 2. The interpolated samples y are sent to the device in the succeeding stage via the FIFO 3 and interface 4.

The foregoing sampling frequency conversion apparatus is supposed to meet the prerequisite that the frequency of a word clock LRCK to be fed from the device in the succeeding stage is the same as the second sampling frequency f2. In an ideal situation where the word clock LRCK has no jitter and the frequency of the word clock LRCK remains constant all the time, the conversional ratio β may be fixed to f1/f2. However, in reality, jitter unavoidably occurs in the word clock LRCK.

If a state where the frequency of the instantaneous word clock LRCK is lower than the second sampling frequency f2 continues, a residual quantity of interpolated samples y that have not been read from the FIFO 3 increases. If the state is left alone, the overflow of the FIFO 3 takes place. On the other hand, if a state where the frequency of the instantaneous word clock LRCK is higher than the second sampling frequency f2 continues, the residual quantity of interpolated samples y that have not been read from the FIFO 3 decreases. If the state is left alone, the underflow of the FIFO 3 takes place.

The control unit 1 performs so-called phase-locked loop (PLL) control for the purpose of absorbing the jitter of the word clock LRCK and preventing occurrence of the overflow or underflow of the FIFO 3. Specifically, the control unit 1 monitors a residual quantity of interpolated samples y that have not been read from the FIFO 3, and increases or decreases a sample input speed for the FIFO 3 according to a variation in the residual quantity so that the residual quantity will be retained at an appropriate range.

Specifically, when the residual quantity of interpolated samples y that have not been read from the FIFO 3 is so large as to fall outside an appropriate range, the control unit 1 increases the conversional ratio β so as to decrease the temporal density (namely to increase an interval) at which each operation command signal CRQ is sequentially generated, and thus decreases the sample input speed for the FIFO 3. On the other hand, when the residual quantity of interpolated samples y that have not been read from the FIFO 3 is so small as to fall outside the appropriate range, the conversional ratio β is decreased to increase the temporal density (namely to decrease an interval) at which each operation command signal CRQ is successively generated. Thus, the sample input speed for the FIFO 3 is increased. Owing to this PLL control, the input speed of the interpolated samples y from the interpolation unit 2 to the FIFO 3 follows the frequency of the word clock LRCK, and the residual quantity of interpolated samples y that have not been read from the FIFO 3 is retained within the appropriate range.

By the way, the sampling frequency conversion apparatus may be used for sampling frequency conversion from the input sampling frequency to the output sampling frequency f2 that is identical to or very close to the input sampling frequency f1 of the input samples x. In this case, the frequency of a word clock LRCK to be sent from the succeeding device to the sampling frequency conversion apparatus may get higher than the sampling frequency f1 for the input samples x due to an adverse effect of jitter. In an example shown in FIG. 18, the device in the succeeding stage is designed to receive and process the interpolated samples y of 48 kHz. Herein for example, the frequency of the word clock LRCK temporarily varies to 59.07 kHz that is larger than the sampling frequency f1=48 kHz for the input samples x due to the adverse effect of jitter. Consequently, the conversional ratio β comes to 48 kHz/59.07 kHz or is smaller than 1. When the conversional ratio β is smaller than 1, the phase information P becomes smaller than 1 within a certain sampling cycle (¹⁄₄₈ kHz). The operation command signal CRQ may be generated, and a result of addition of β−1 to the phase information P may be negative within the next sampling cycle. In this case, although the operation command signal CRQ is generated, since the interpolative ratio α is negative, the sequence of interpolative coefficients h[k] (k=0 to N−1) to be used for an interpolative operation cannot be calculated. This poses a problem in that the interpolative operation causes an error. In order to avoid occurrence of an error during the interpolative operation, jitter of the word clock LRCK to be fed from the device in the succeeding stage to the sampling frequency conversion apparatus has to be reduced as greatly as possible. Moreover, in the basic sampling frequency conversion apparatus, even when the jitter of the word clock LRCK is little, if the output sampling frequency requested by the device in the succeeding stage is equal to or larger than the input sampling frequency of input samples, the sampling frequency cannot be converted without occurrence of the error in the interpolative operation.

Now referring to the drawings, the best mode for carrying out the invention will be described below.

Figure 1:
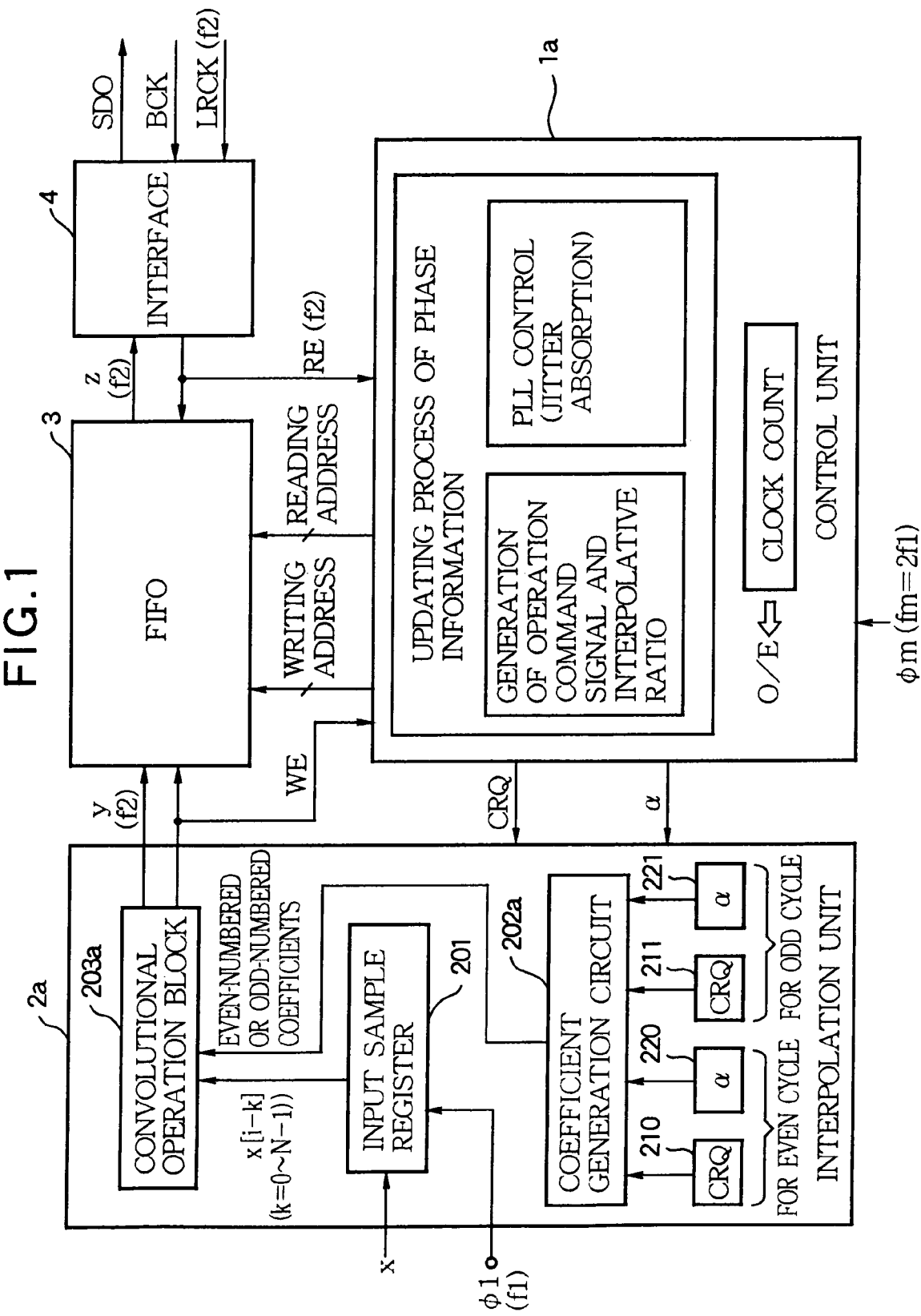
FIG. 1 is a block diagram showing the configuration of a sampling frequency conversion apparatus that is an embodiment of the present invention.

FIG. 1 is a block diagram showing the configuration of a sampling frequency conversion apparatus in accordance with an embodiment of the present invention. In the drawing, a FIFO 3 and an interface 4 are identical to those contained in the basic sampling frequency conversion apparatus shown in FIG. 12. In the sampling frequency conversion apparatus according to the present embodiment, the control unit 1 and interpolation unit 2 contained in the basic sampling frequency conversion apparatus shown in FIG. 12 are replaced with a control unit 1a and an interpolation unit 2a respectively. The features of the present embodiment lie in the improvements concerning the control unit 1a and the interpolation unit 2a which are described below.

Improvement 1: the interpolation unit 2a performs double over-sampling based on nominal zero-point insertion when calculating interpolated samples y by performing an interpolative operation using an original sequence of input samples (hereinafter, an input sample string) fed from a device in a preceding stage.

Improvement 2: the control unit 1a updates positional information P synchronously with a main clock φm whose frequency is a double of the sampling frequency f1 for input samples x fed from the device in the preceding device.

Hereinafter, first, the interpolation unit 2a will be detailed while being centered on the improvement 1, and the control unit 1a will then be detailed while being centered on the improvement 2.

In the interpolation unit 2 according to the basic structure, when the input samples x for which the sampling frequency f1 is set to, for example, 48 kHz are fed from the device in the preceding stage, a 22nd-order interpolative operation for convoluting a sequence of twenty-two interpolative coefficients h[k] (k=0 to 21) to a sequence of twenty-two input samples x[i−k] (k=0 to 21) that have been inputted up to a current time point i (FIG. 2 shows samples x[21] to x[0] for prevention of complexity) is performed in order to calculate an interpolated sample y. Consequently, in the basic sampling frequency conversion apparatus, when a post-conversion sampling frequency is 48 kHz identical to a pre-conversion sampling frequency, an interpolative ratio α becomes negative due to an adverse effect of jitter in a word clock LRCK fed from the device in the succeeding stage. Consequently, an error may occur in the interpolative operation.

As a method for avoiding occurrence of an error in an interpolative operation, a method of performing double over-sampling may be conceivably applied to samples x of a sampling frequency of 48 kHz fed from a device in a preceding stage so that the sampling frequency for a sample string to be used for the interpolative operation is made higher than the original sampling frequency for an input sample string is conceivable. To be more specific, as shown in FIG. 3, a zero point is inserted to each pair of twenty-two input samples x[21] to x[0] that have been fed up to a current time point, and decimation processing (low-pass filter processing) is performed on the resultant input samples in order to obtain an oversampled sequence of input samples x'[43] to x'[0] of forty-four input samples for which the sampling frequency f1 is set to 96 kHz. A 44th-order interpolative operation for convoluting a sequence of forty-four interpolative coefficients h[k] (k=0 to 43) to the oversampled input sample string is performed in order to calculate an interpolated sample y.

However, when double over-sampling is actually performed according to the foregoing method, a processing load is imposed on the interpolation unit 2a. Moreover, since the order of an interpolative operation to be performed after the over-sampling is doubled, a processing load therefor is imposed on the interpolation unit 2a. Consequently, it is not advantageous to actually perform double over-sampling according to the method.

As already mentioned, since an interpolative operation for obtaining interpolated samples y is to convolute a function value string of a sampling function, which represents an impulse response of an ideal low-pass filter, to an input sample string, the interpolative operation fills the role of decimation processing (low-pass filter processing). Consequently, zero-point insertion for double over-sampling and decimation processing can be omitted. Therefore, a method of inserting a zero point to each pair of twenty-two input samples x[21] to x[0] of 48 kHz in order to produce forty-four input samples x'[43] to x'[0] of 96 kHz, and performing an interpolative operation on the forty-four input samples in order to calculate the interpolated sample y is conceivable. However, in this case, the order of the interpolative operation is doubled to be forty-four-th. A processing load therefor is imposed on the interpolation unit 2a.

Consequently, in the present embodiment, double over-sampling based on "nominal" zero-point insertion is performed in order to calculate interpolated samples y from input samples x[i−k] (k=0 to N−1). Namely, the interpolated samples y are calculated in a mode in which: zero-point insertion for the input samples x[i−k] (k=0 to N−1) stored in the input sample register 201 and decimation processing are not actually performed; but an advantage identical to the one provided in a case where double over-sampling based on zero-point insertion is performed on the input samples x[i−k] (k=0 to N−1) is provided. Specifically, the calculation is performed as mentioned below.

Figure 4:
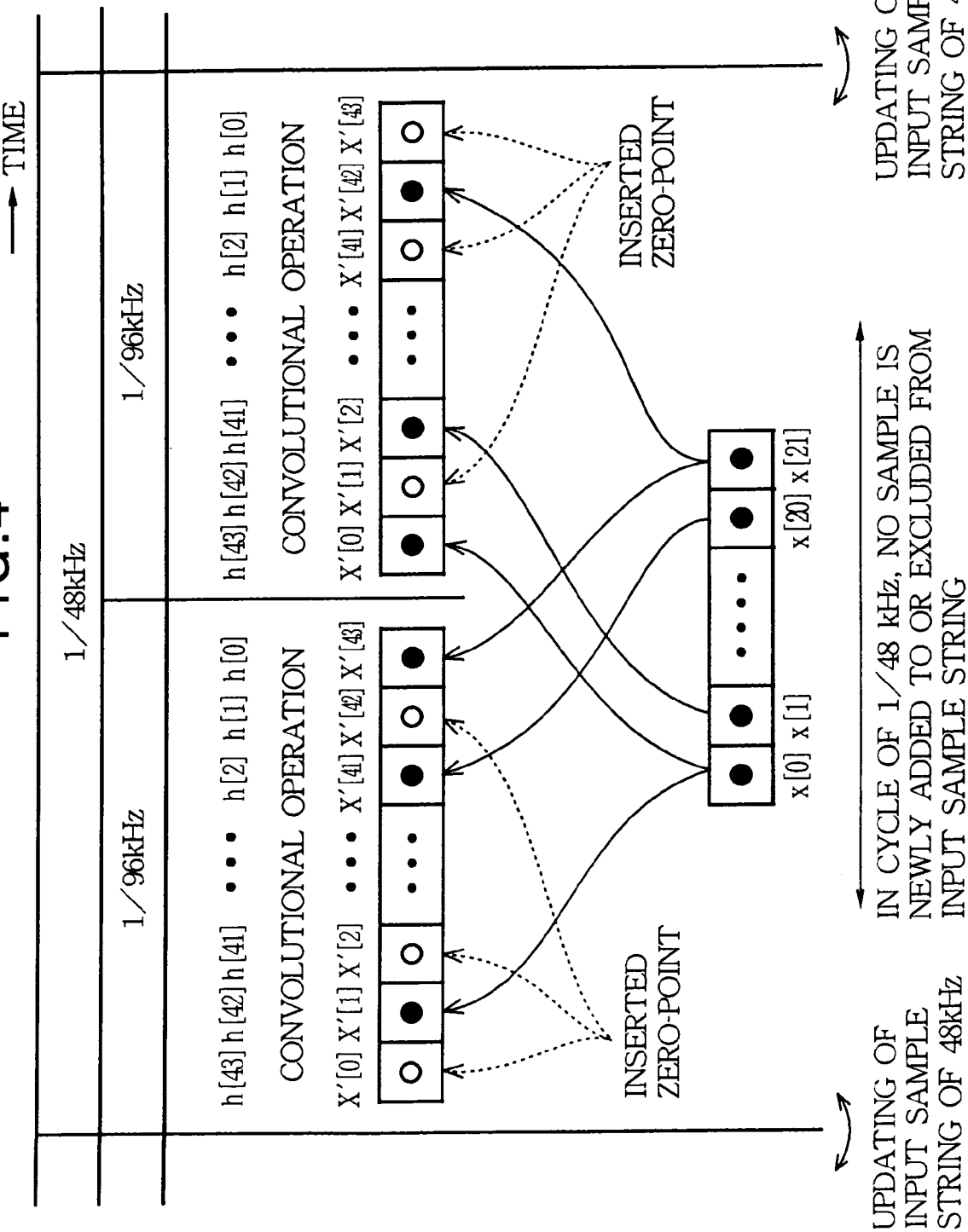
FIG. 4 is a diagram for explaining the contents of processing for an even cycle in an interpolative operation accompanied by double over-sampling based on zero point insertion and the contents of processing for an odd cycle therein.

FIG. 4 shows the contents of processing to be performed in a case where input samples x are sequentially fed from a device in a preceding stage in cycles of 1/48 kHz, zero-point insertion is actually performed on the original input sample string, and an oversampled input sample string of forty-four samples obtained after zero-point insertion is used to perform a 44th-order interpolative operation in cycles of 1/96 kHz. In FIG. 4, for prevention of the illustration from being complex, input samples x[i−k] (k=0 to 21) fed from the device in the preceding stage are samples x[21] to x[0], and an interpolative-operation sample string x'[i−k] (k=0 to 43) obtained after zero-point insertion is a string x'[43] to x'[0].

When an input sampling frequency for the input samples x is 48 kHz, no sample is newly added to the interpolative-operation input sample string x'[43] to x'[0] within a cycle of 1/48 kHz. Moreover, no sample is excluded from the interpolative-operation input sample string x'[43] to x'[0].

In the first-half 1/96 kHz cycle of the 1/48 kHz cycle, the contents of samples x'[43], x'[41], etc., and x'[1] out of the interpolative-operation input sample string x'[43] to x'[0] are the original input samples x[21] to x[0], and the contents of samples x'[42], x'[40], etc., and x'[0] are zero points. Interpolative coefficients h[0], h[1], etc., h[42], and h[43] for a 44th-order interpolative operation are convoluted to the interpolative-operation input sample string x'[43] to x'[0].

In the convolutional operation, the samples x'[42], x'[40], etc., and x'[0] that are zero points are multiplied by odd-numbered interpolative coefficients h[1], h[3], etc., and h[43] respectively. The results of the multiplication are all zeroes. On the other hand, the samples x'[43], x'[41], etc., and x'[1] that are not zero points are the original input samples x[21] to x[0] of 48 kHz, and are multiplied by even-numbered interpolative coefficients h[0], h[2], etc., and h[42] respectively.

When the second-half 1/96 kHz cycle of the 1/48 kHz cycle comes, the interpolative-operation input sample string x'[43] to x'[0] is shifted by one sample. At this time, the content of the trailing (oldest) sample x'[0] (in this case, a zero point) is removed, and a zero point is assigned to the leading (latest) sample x'[43]. Consequently, in the interpolative-operation input sample string x'[43] to x'[0], the contents of the samples x'[42], x'[40], etc., and x'[0] are the original input samples x[21] to x[0], and the contents of the samples x'[43], x'[41], etc., and x'[1] are zero points. The interpolative coefficients h[43], h[42], etc., h[1], and h[0] for a 44th-order interpolative operation are convoluted to the interpolative-operation input sample string x'[43] to x'[0].

In the convolutional operation, the samples x'[43], x'[41], etc., and x[1] that are zero points are multiplied by the even-numbered interpolative coefficients h[0], h[2], etc., and h[42] respectively. The results of the multiplication are all zeroes. On the other hand, the samples x'[42], x'[40], etc., and x'[0] that are not zero points are the original input samples x[21] to x[0] of 48 kHz, and are multiplied by the odd-numbered interpolative coefficients h[1], h[3], etc., and h[43] respectively.

As described above, when zero-point insertion is actually performed on an original input sample string of a sampling frequency of 48 kHz, if the oversampled input sample string obtained after zero-point insertion is used to perform an interpolative operation in cycles of 1/96 kHz, multiplicative processing of zero points by interpolative coefficients arises. The multiplicative processing is fruitless and need not be executed. On the other hand, in an interpolative operation performed in cycles of 1/96 kHz, samples other than inserted zero points out of the interpolative-operation input sample string are the original input samples of 48 kHz. A difference between the first-half 1/96 kHz cycle and the second-half 1/96 Hz cycle lies in a point that the interpolative coefficients to be used for multiplication of the original input samples of 48 kHz in the first-half 1/96 kHz cycle are even-numbered interpolative coefficients, but the interpolative coefficients to be used in the second-half 1/96 kHz cycle are odd-numbered interpolative coefficients.

Figure 5:
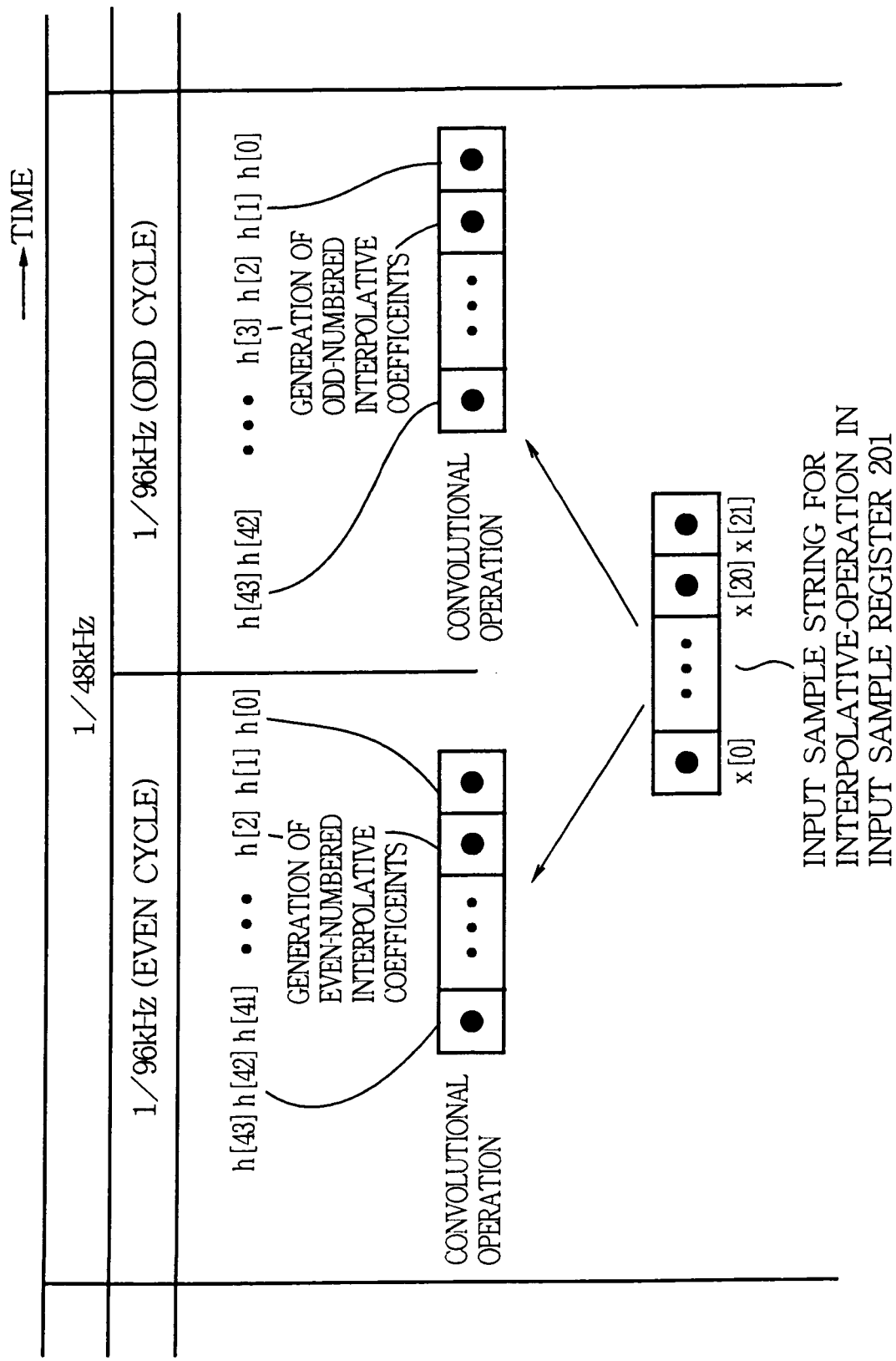
FIG. 5 is a diagram for explaining the contents of processing for an even cycle of an interpolative operation adopted by the embodiment and the contents of processing for an odd cycle thereof.

In consideration of the foregoing point, in the present embodiment, an interpolative operation is performed on original input samples according to the method shown in FIG. 5. To begin with, the input sample register 201 shown in FIG. 1 is, similarly to that included in the basic structure, caused to update the stored contents thereof (interpolative-operation input sample string) synchronously with a clock having the same frequency as the sampling frequency f1 for the input samples x.

A sampling cycle of 1/48 kHz during which an interpolative-operation input sample string of the same contents is held in the input sample register 201 is divided into a first-half 1/96 kHz cycle (hereinafter an even cycle) and a second-half 1/96 kHz cycle (hereinafter an odd cycle).

For calculation of an interpolated sample y in the even cycle, even-numbered interpolative coefficients out of 2N interpolative coefficients h(k) (k=0 to 2N−1) (in FIG. 5, h[0] to h[43]) used for 2Nth-order interpolation associated with an interpolative ratio α are generated, and convoluted to the interpolative-operation input sample string x[i−k] (k=0 to N−1) (in FIG. 5, x[21] to x[0]) stored in the input sample register 201. On the other hand, for calculation of the interpolated sample y in the odd cycle, odd-numbered interpolative coefficients out of the 2N interpolative coefficients h(k) (k=0 to 2N−1) used for 2Nth-order interpolation associated with the interpolative ratio α are generated, and convoluted to the interpolative-operation input sample string x[i−k] (k=0 to N−1) (in FIG. 5, x[21] to x[0]) stored in the input sample register 201.

According to the method, there is provided an advantage identical to the advantage to be provided when double oversampling based on zero-point insertion is performed on an input sample string x[i−k] (k=0 to N−1), and interpolated samples y are calculated by performing an interpolative operation of an order that is a multiple of an original order.

In the present embodiment, both calculation of interpolated samples y in an even cycle and calculation of the interpolated samples y in an odd cycle are performed. Consequently, the control unit 1a performs updating process of phase information P synchronously with a main clock φm having a frequency fm (=2f1=96 kHz) that is a double of the sampling frequency f1=48 kHz (see FIG. 1). An operation command signal CRQ and an interpolative ratio α are generated in the course of the updating process of the phase information P. Moreover, in the present embodiment, whether the timing of generating the operation command signal CRQ and interpolative ratio α belongs to the even cycle or odd cycle has to be distinguished. Therefore, the control unit 1a counts the main clock φm, and outputs a 1-bit odd/even instruction signal O/E, which is 0 for the even cycle and 1 for the odd cycle, to the interpolation unit 2a.

As shown in FIG. 1, the interpolation unit 2a includes two registers 210 and 211 for holding the operation command signal CRQ, and two registers 220 and 221 for holding the interpolative ratio α as phase information. Herein, the registers 210 and 220 are temporary storages for the even cycle, and the registers 211 and 221 are temporary storages for the odd cycle. Specifically, the operation command signal CRQ and interpolative ratio α outputted from the control unit 1a in the even cycle where the odd/even instruction signal O/E is 0 are held in the registers 210 and 220 respectively. The operation command signal CRQ and interpolative ratio α outputted from the control unit 1a in the odd cycle where the odd/even instruction signal O/E is 1 are held in the registers 211 and 221 respectively.

When the operation command signal CRQ and interpolative ratio α are held in the even-cycle registers 210 and 220 respectively, a coefficient generation circuit 202a generates a second sequence of twenty-two even-numbered interpolative coefficients from a first sequence of forty-four interpolative coefficients h[k] (k=0 to 43] associated with the held interpolative ratio α, and feeds the interpolative coefficients to a convolutional operation block 203a.

Figure 6:
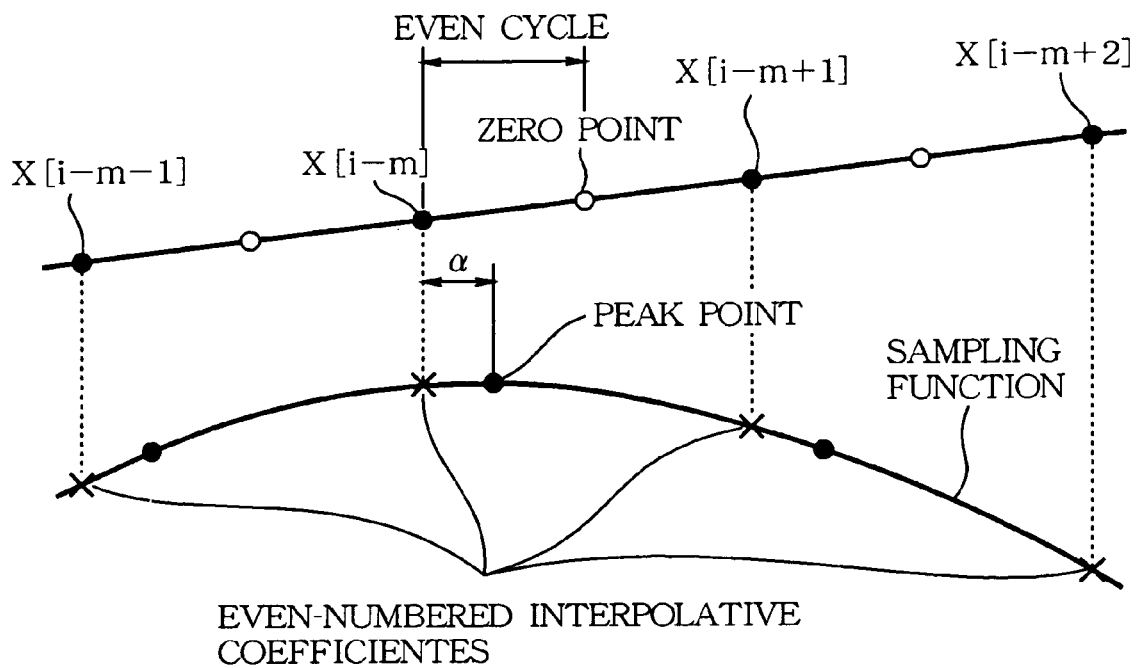
FIG. 6 is a diagram showing interpolative coefficients to be used to calculate interpolated samples for the even cycle in the embodiment.

FIG. 6 is a diagram showing a method of generating the interpolative coefficients. In the present embodiment, the interpolative ratio α to be generated in the even cycle signifies that a sampling point for each interpolated sample y to be obtained leads by an α cycle (where one cycle is, unlike the one in the basic structure, 1/96 kHz) a sampling point for a sample x[i−m] out of samples x[i−k] (k=0 to 21) stored in the input sample register 201. When the interpolative ratio α is generated together with the operation command signal CRQ in the even cycle, the coefficient generation circuit 202a outputs as interpolative coefficients sampling function values having the same phases as those of the sampling points for the samples x[i−k] (k=0 to 21) with a peak point of a sampling function located at a point of a phase that leads by the α cycle the sampling point for the sample x[i−m]. The interpolative coefficients are twenty-two even-numbered interpolative coefficients out of forty-four interpolative coefficients by which forty-four samples including virtual zero points are multiplied.

On the other hand, when the operation command signal CRQ and interpolative ratio α are held in the odd-cycle registers 211 and 221 respectively, the coefficient generation circuit 202a generates a second sequence of twenty-two odd-numbered interpolative coefficients from the first sequence of the forty-four interpolative coefficients h[k] (k=0 to 43) associated with the held interpolative ratio α, and feeds the interpolative coefficients to the convolutional operation block 203a.

Figure 7:
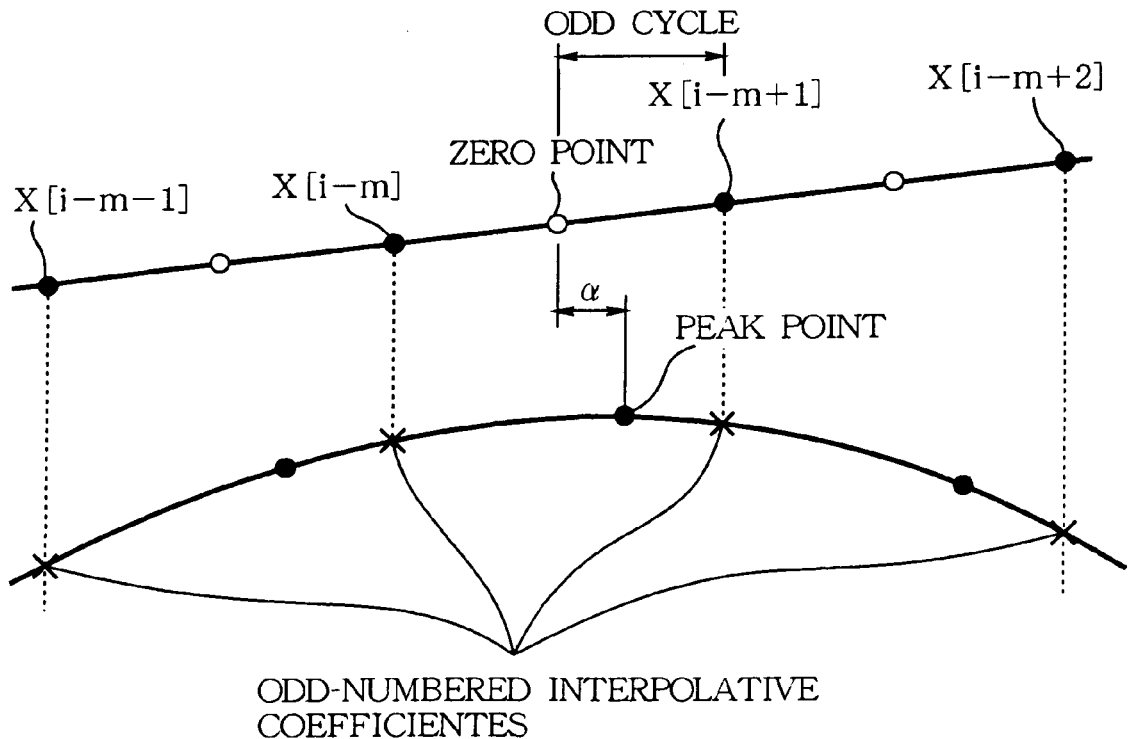
FIG. 7 is a diagram showing interpolative coefficients used to calculate interpolated samples for the odd cycle in the embodiment.

FIG. 7 is a diagram showing a method of generating interpolative coefficients. In the present embodiment, the interpolative ratio α generated in the odd cycle signifies that a sampling point for each interpolated sample y to be obtained lies to lead by the α cycle (noted is that one cycle is, unlike the one in the basic structure, 1/96 kHz) a virtual zero point between a sample x[i−m] and a sample x[i−m+1] out of the samples x[i−k] (k=0 to 21) stored in the input sample register 201. When the interpolative ratio α is generated together with the operation command signal CRQ in the odd cycle, the coefficient generation circuit 202a outputs as interpolative coefficients sampling function values having the same phases as those of the sampling points for the samples x[i−k] (k=0 to 21) with a peak point of a sampling function located at a point of a phase leading by the α cycle a virtual zero point between the sample x[i−m] and the sample x[i−m+1]. The interpolative coefficients are twenty-two odd-numbered interpolative coefficients out of the forty-four interpolative coefficients by which the forty-four samples including virtual zero points are multiplied.

The convolutional operation block 203a convolutes the twenty-two interpolative coefficients, which are outputted from the coefficient generation circuit 202a as mentioned above, to the interpolative-operation input sample string x[i−k] (k=0 to 21) of twenty-two samples stored in the input sample register 201 so as to calculate the interpolated sample y, and feeds the interpolated sample y together with a writing request signal WE to the FIFO 3.

Herein, in the even cycle, the interpolated samples y may be calculated at any timing within the sampling cycle of 1/48 kHz. Likewise, in the odd cycle, the interpolated samples y may be calculated at any timing within the sampling cycle of 1/48 kHz.

In the present embodiment, for both calculation of the interpolated samples y in the even cycle within the sampling cycle of ⅛s kHz and calculation of the interpolated samples y in the odd cycle, the operation command signal CRQ and interpolative ratio α may be generated. In this case, the interpolation unit 2a sequentially calculates the interpolated samples y in the even cycle within the sampling cycle of ⅛s kHz, and sequentially calculates the interpolated samples y in the odd cycle. The interpolation unit 2a has been detailed so far.

As described above in conjunction with the drawings, the inventive sampling frequency conversion apparatus is designed for applying an interpolative operation to input samples x having an input sampling frequency f1 so as to compute interpolated samples y having an output sampling frequency f2 which is specified by a succeeding device, and for outputting the interpolated samples y to the succeeding device. In the sampling frequency conversion apparatus, an input sample register 201 stores a predetermined number of input samples x as an original sequence of input samples for the interpolative operation. A coefficient generating part 202a prepares a first sequence of interpolative coefficients corresponding to an oversampled sequence of input samples which are obtained by inserting nominal input samples of zero values to the input samples stored in the input sample register 201, and generates a second sequence of interpolative coefficients which are extracted from the first sequence of the interpolative coefficients and which correspond to the original sequence of the input samples x. A convolutional operation part 203a convolutes the second sequence of the interpolative coefficients with the original sequence of the input samples x so as to output the interpolated sample y.

Further in the sampling frequency conversion apparatus, a control part 1a operates in synchronization with a main clock φm having a frequency 2f1 twice as high as the input sampling frequency f1 of the input samples x, for updating phase information α indicating a phase relation between the original sequence of the input samples x and a sequence of interpolated samples y to be generated, and generates an operation command signal CRQ instructing the interpolative operation for generating the interpolated sample y when the updated phase information α satisfies a predetermined condition.

The input sample register 201 operates in synchronization with a frequency identical to the input sampling frequency f1 of the input samples, for sequentially fetching the input samples x and storing N number of newest ones of the fetched input samples x as the original sequence of the input samples x for the interpolative operation.

Further in the sampling frequency conversion apparatus, an even cycle operation command register 210 operates in synchronization with the main clock for storing the operation command signal CRQ when the same is generated in an even cycle of the main clock, and an even cycle phase information register 220 stores the phase information α associated with the operation command signal CRQ generated in the even cycle of the main clock. In similar manner, an odd cycle operation command register 211 operates in synchronization with the main clock for storing the operation command signal CRQ when the same is generated in an odd cycle of the main clock, and an odd cycle phase information register 221 stores the phase information α associated with the operation command signal CREQ generated in the odd cycle of the main clock.

The coefficient generating part 202a operates when the operation command signal CRQ is stored in the even cycle operation command register 210 for performing an even interpolative coefficient generation process such as to generate the second sequence of the interpolative coefficients composed of N number of even interpolative coefficients which are extracted from the first sequence of 2N number of the interpolative coefficients which correspond to the oversampled sequence of 2N number of input samples such that the second sequence of the interpolative coefficients has the phase relation relative to the original sequence of the input samples x as indicated by the phase information α stored in the even cycle phase information register 220.

The coefficient generating part 202a operates when the operation command signal CRQ is stored in the odd cycle operation command register 211 for performing an odd interpolative coefficient generation process such as to generate the second sequence of the interpolative coefficients composed of N number of odd interpolative coefficients which are extracted from the first sequence of 2N number of the interpolative coefficients corresponding to the oversampled sequence of 2N number of input samples such that the second sequence of the interpolative coefficients has the phase relation relative to the original sequence of the input samples as indicated by the phase information α stored in the odd cycle phase information register 221.

The coefficient generating part 202a operates when the operation command signal CRQ is stored in both the even cycle operation command register 210 and the odd cycle operation command register 211 for performing both the even interpolative coefficient generation process and the odd interpolative coefficient generation process.

The convolutional operation part 203a operates each time the second sequence of the N number of the interpolative coefficients are generated by the coefficient generating part 202a for performing a convolutional operation of the second sequence of N number of the coefficients and the original sequence of the N number of the input samples x to output the interpolated sample y.

The coefficient generating part 202a prepares the first sequence of the interpolative coefficients corresponding to the oversampled sequence of input samples which are obtained by inserting nominal input samples of zero values to the input samples x stored in the input sample register 201 so that the oversampled sequence of the input samples has an oversampling frequency twice as high of the input sampling frequency f1, such that each cycle of the input sampling frequency f1 is divided into an even cycle and an odd cycle in correspondence to each cycle of the oversampling frequency 2f1, and such that the first sequence of the interpolative coefficients contains even interpolative coefficients and odd interpolative coefficients corresponding to even cycles and odd cycles of the oversampling frequency 2f1. The coefficient generating part 202a operates at an even cycle for generating the second sequence of the even interpolative coefficients which are extracted from the first sequence of the interpolative coefficients, and operates at an odd cycle for generating the second sequence of the odd interpolative coefficients which are extracted from the first sequence of the interpolative coefficients. The convolutional operation part 2a operates at the even cycle for convoluting the second sequence of the even interpolative coefficients with the original sequence of the input samples x so as to output the interpolated sample y, and operates at the odd cycle for convoluting the second sequence of the odd interpolative coefficients with the original sequence of the input samples x so as to output the interpolated sample y.

The coefficient generating part 202a prepares the first sequence of the interpolative coefficients which are twice as many as the number of input samples x contained in the original sequence of the input samples stored in the input sample register 201.

Figure 8:
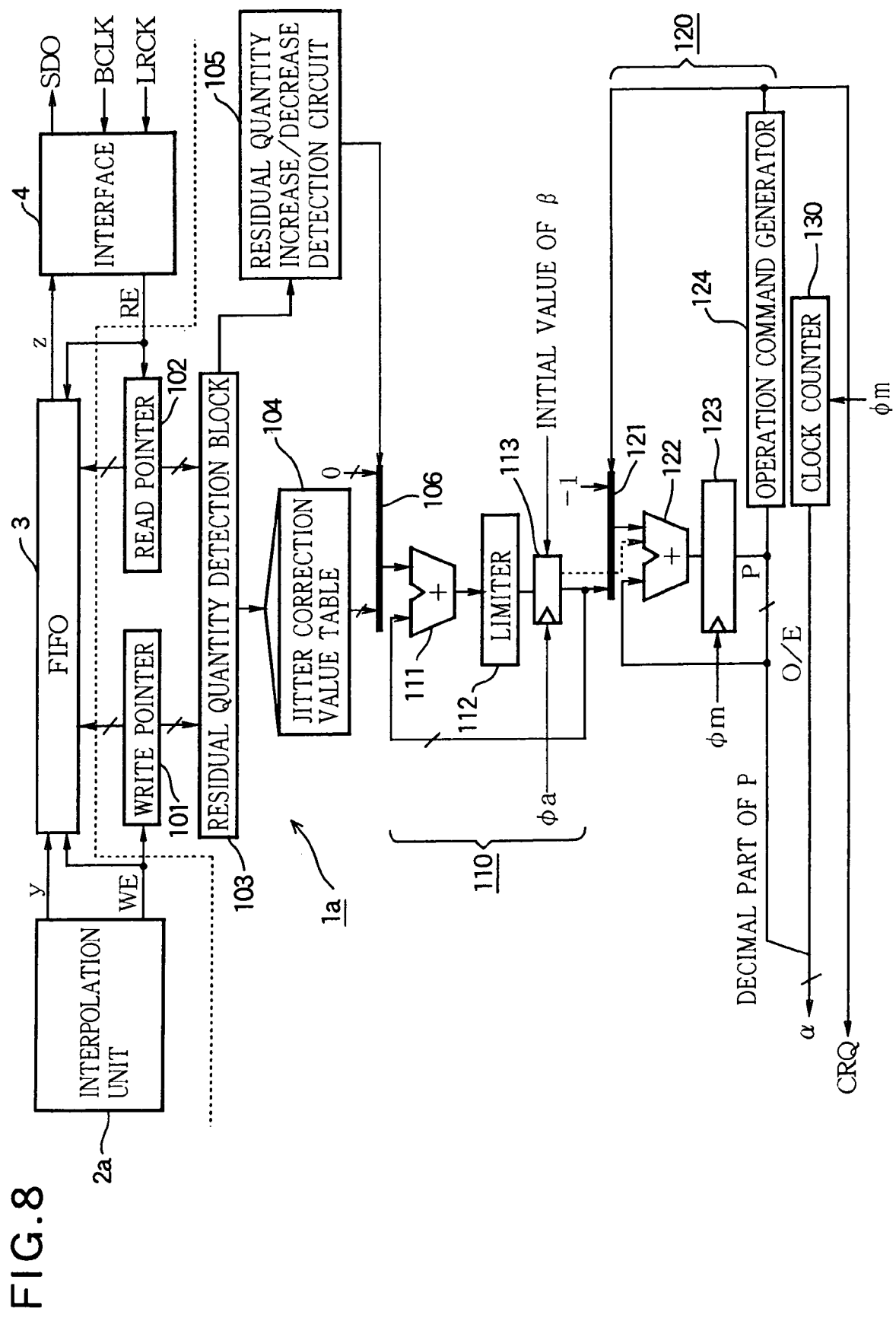
FIG. 8 is a block diagram showing the detailed configuration of a control unit $1a$ provided in the embodiment.

Next, referring to FIG. 8, the control unit 1a will be detailed. A write pointer 101 is a circuit that increments a writing address responsively to the output of a writing request signal WE from the interpolation unit 2a, and feeds the writing address to the FIFO 3. When the interpolation unit 2a outputs the interpolated sample y together with the writing request signal WE, the interpolated sample y sent from the interpolation unit 2a is written in an area in the FIFO 3 designated with the writing address outputted from the write pointer 101. A read pointer 102 sequentially increments a reading address in response to a reading request signal RE sent from the interface 4, and feeds the reading address to the FIFO 3. Herein, the reading address designates the oldest one of the interpolated samples y that have not been read and remain in the FIFO 3. An interpolated sample y designated with the reading address is read from the FIFO 3 in response to the reading request signal RE, and fed to the interface 4.

A residual quantity detection block 103 is a circuit that detects a difference between a writing address generated by the write pointer 101 and a reading address generated by the read pointer 102, that is, the residual quantity of interpolated samples y that have not been read and remain in the FIFO 3 at a current time point. A jitter correction value table 104 is a table associating residual quantities of interpolated samples y with jitter correction values, and outputs a jitter correction value associated with the residual quantity detected by the residual quantity detection block 103. Herein, the jitter correction value is used to correct a conversional ratio $\beta$ that determines a temporal density or interval at which each operation command signal CRQ is sequentially generated. More accurately, the interval of CRQ is an inverse of temporal density of CRQ. In the jitter correction value table 104, the residual quantities falling within an appropriate range are associated with a jitter correction value that is 0. Moreover, as for the residual quantities exceeding the appropriate range, a larger value is associated with a jitter correction value that is larger in a negative direction. As for the residual quantities falling below the appropriate range, a smaller value is associated with a jitter correction value that is larger in a positive direction. A residual quantity increase/decrease detection circuit 105 is a circuit that detects an abrupt change in the residual quantity detected by the residual quantity detection block 103. When an abrupt change in the residual quantity is detected by the residual quantity increase/detection circuit 105, a selector 106 selects and outputs a jitter correction value outputted from the jitter correction value table 104. Otherwise, the selector 106 selects and outputs 0 as the jitter correction value.

A frequency correction block 110 is a circuit that corrects a conversional ratio $\beta$ according to a jitter correction value, and includes an adder 111, a limiter 112, and a latch 113. Herein, a clock $\phi a$ is fed to the latch 113. The clock $\phi a$ is faster than the main clock $\phi m$, and has a frequency of, for example, 9 MHz. When the sampling frequency conversion apparatus starts operating, a value fm/f2 calculated by dividing the frequency fm of the main clock $\phi m$ by the post-conversion sampling frequency f2 is set as an initial value of the conversional ratio $\beta$ in the latch 113. Thereafter, the latch 113 updates the conversional ratio $\beta$, which is fed from the adder 111 through the limiter 112, every time the clock $\phi a$ is fed. The adder 111 adds the jitter correction value, which is fed from the selector 106, to the conversional ratio $\beta$ outputted from the latch 113, and outputs a resultant value. If the conversional ratio $\beta$ outputted from the adder 111 falls outside an appropriate range, the limiter 112 fills the role of confining the conversional ratio $\beta$ to the appropriate range. According to the configuration, when the jitter correction value of 0 is outputted from the selector 106, the conversional ratio $\beta$ outputted from the latch 113 does not change. When a negative jitter correction value is outputted from the selector 106, the conversional ratio $\beta$ outputted from the latch 113 decreases along with the passage of time. When a positive jitter correction value is outputted, the conversional ratio $\beta$ outputted from the latch 113 increases along with the passage of time. A temporal gradient of the decrease in the conversional ratio $\beta$ or a temporal gradient of the increase therein gets larger as the absolute value of the jitter correction value gets larger.

A phase information update block 120 is a circuit that updates the phase information P synchronously with the main clock $\phi$, and that generates the operation command signal CRQ at a temporal density, which is inversely proportional to the conversional ratio $\beta$, in the course of updating. The phase information update block 120 includes a selector 121, an adder 122, a latch 123, and an operation command generator 124. When the operation command signal CRQ is driven to an inactive level, the selector 121 outputs −1 to the adder 122. When the operation command signal CRQ is driven to an active level, the selector 121 outputs data, which is calculated by subtracting 1 from the conversional ratio $\beta$ fed from the frequency correction block 110, to the adder 122. The adder 122 is a circuit that adds data, which is fed via the selector 121, to the phase information P held in the latch 123 so as to update the phase information P. The latch 123 is a circuit that holds the phase information P outputted from the adder 122 every time the main clock $\phi m$ is fed. When the phase information P outputted from the latch 123 is equal to or larger than 1, the operation command generator 124 drives the operation command signal CRQ to the inactive level. When the phase information P gets smaller than 1, the operation command generator 124 drives the operation command signal CRQ to the active level during a period equivalent to one cycle of the clock $\phi m$. According to the configuration, during the period during which the phase information P is equal to or larger than 1, the operation command signal CRQ is driven to the inactive level, and −1 is fed to the adder 122 via the selector 121. Consequently, the phase information P outputted from the latch 123 with every generation of the main clock $\phi m$ is decremented by one. When the phase information P gets smaller than 1, the operation command signal CRQ is driven to the active level and the data calculated by subtracting 1 from the conversional ratio $\beta$ is fed to the adder 122 via the selector 121. Therefore, the phase information P increases by $\beta-1$. Consequently, the operation command signal CRQ is driven to the active level at a temporal density that is inversely proportional to the conversional ratio $\beta$.

A clock counter 130 is a 1-bit counter that reverses the odd/even instruction signal O/E with every generation of the main clock $\phi m$. Herein, the clock counter 130 sets the odd/even instruction signal O/E to 0 in the first-half even cycle within one sampling cycle (1/48 kHz) within which the input sampling register 201 holds the interpolative-operation input sample string x[i−k] (k=0 to 21) having the same contents. In the odd cycle, the odd/even instruction signal O/E is set to 1. What is obtained by adding the odd/even instruction signal O/E as the most significant bit to a bit string of a decimal part of the phase information P is regarded as the interpolative ratio $\alpha$. The interpolative ratio $\alpha$ is fed together with the operation command signal CRQ to the interpolation unit 2a. The configuration of the control unit 1a has been detailed so far.

As described above, in the inventive sampling frequency conversion apparatus, an interface 4 receives a word clock LRCK having the same frequency f2 as the output sampling frequency f2 specified by the succeeding device, and transmits the interpolated samples y successively fed from the convolutional operation part 203a to the succeeding device in synchronization with the word clock LRCK. The control part 1a controls an interval of the operation command signals CRQ which are successively generated each time the updated phase information a satisfies the predetermined condition so as to allow the interval of the operation command signals CRQ to follow the frequency of the word clock f2.

Further in the sampling frequency conversion apparatus, a first-in first-out buffer 3 sequentially stores the interpolated samples y outputted from the convolutional operation part 203a, and sequentially reads and outputs the interpolated samples y from the old ones stored in the first-in first-out buffer 3 in response to the word clock LRCK. The control part 1a includes a residual quantity detecting part 103 for detecting a residual quantity of the interpolated samples y that have not been read from the first-in first-out buffer 3, and controls on the basis of the residual quantity detected by the residual quantity detecting part 103 so as to allow the interval of the operation command signals CRQ to follow the frequency of the word clock LRCK.

Figure 9:
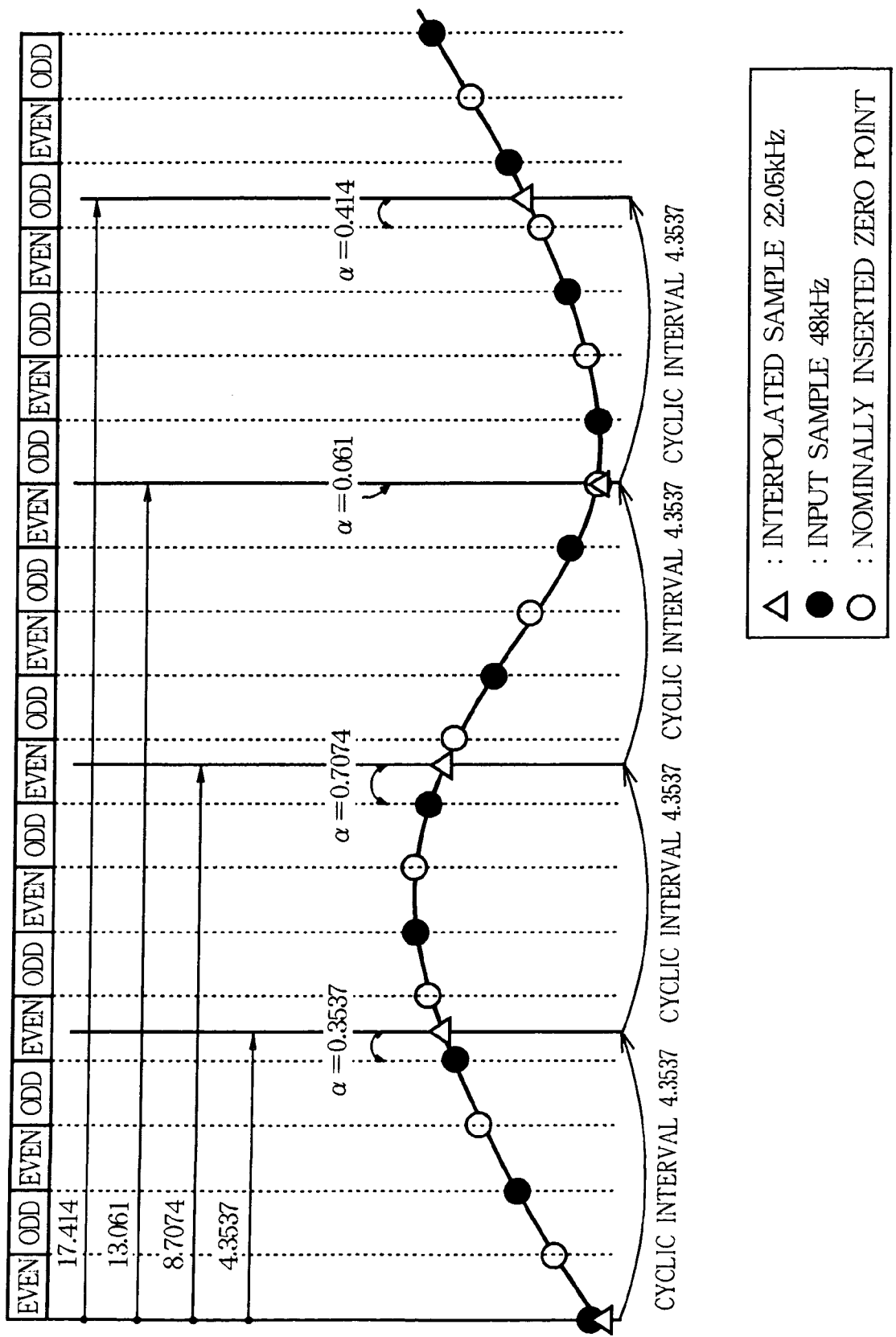
FIG. 9 is a diagram showing an example of operation of the embodiment.
Figure 10:
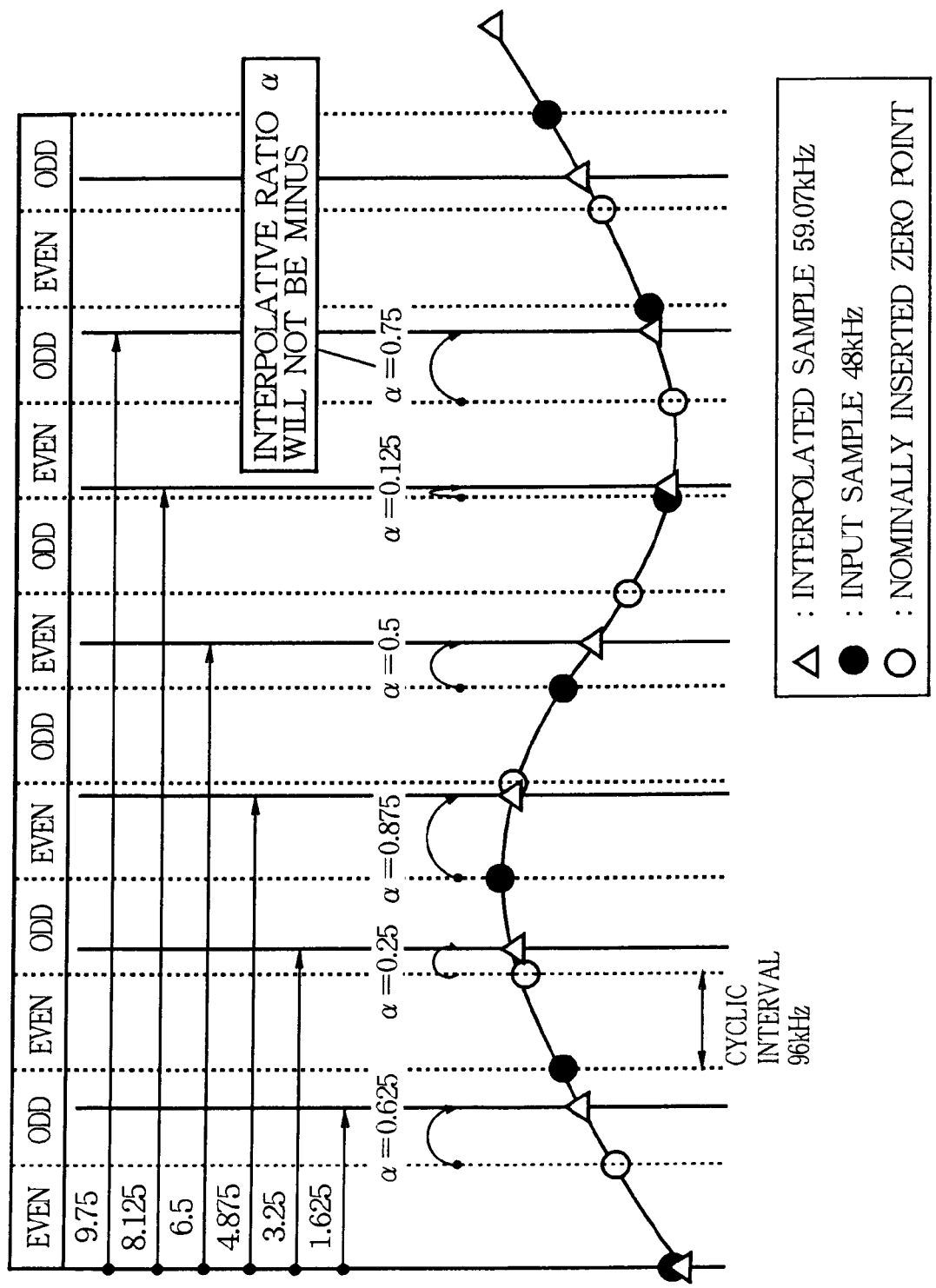
FIG. 10 is a diagram showing an example of operation of the embodiment.

FIG. 9 and FIG. 10 show examples of the operation of the present embodiment. In the example shown in FIG. 9, the frequency f2 of the word clock LRCK to be fed from the device in the succeeding stage is 22.05 kHz. In the control unit 1a, the residual quantity of interpolated samples y in the FIFO 3 is detected by the residual quantity detection block 103.

When the residual quantity is larger than the appropriate range, control is extended to increase the conversional ratio β, decrease the temporal density at which the operation command signal CRQ is generated, and lower the input speed for the interpolated samples y from the interpolation unit 2a to the FIFO 3. On the other hand, when the residual quantity is smaller than the appropriate range, control is extended to decrease the conversional ratio β, increase the temporal density at which the operation command signal CRQ is generated, and raise the input speed for the interpolated samples y from the interpolation unit 2a to the FIFO 3.

As a result of repletion of the control, when the conversional ratio β comes to 96 kHz/22.05 kHz=4.3537, the temporal density for the operation command signal CRQ generated synchronously with the main clock φm of 96 kHz squares with the frequency f2=22.05 kHz of the word clock LRCK. The residual quantity of interpolated samples y in the FIFO 3 is confined to the appropriate range. Sampling frequency conversion with the conversional ratio β set to 4.3537 is carried out. The interpolated samples y of 22.05 kHz resulting from the sampling frequency conversion are sent to the device in the succeeding stage via the FIFO 3 and interface 4.

In the present embodiment, update of the phase information P and generation of the operation command signal CRQ based on the result of the update are performed synchronously with the clock φm of the frequency fm of 96 kHz. The operation command signal CRQ may therefore be generated in the even cycle of the clock φm or may be generated in the odd cycle. However, in the case of the example, since the conversional ratio β is 4.3537, the phase information P gets smaller than 1, and the operation command signal CRQ is generated. When the main clock φm is generated next, the phase information P is increased by β−1=3.3537. Consequently, the interpolative ratio α will not be negative.

In the example shown in FIG. 10, the frequency f2 of the word clock LRCK fed from the device in the succeeding stage is 59.07 kHz and higher than the sampling frequency f1=48 kHz for the input samples x fed from the device in the preceding stage. In the aforesaid basic sampling frequency conversion apparatus, when the word clock LRCK whose frequency is higher than the sampling frequency f1 for the input samples x is fed from the device in the succeeding stage, the interpolative ratio α becomes negative. An interpolative operation therefore causes an error. However, in the present embodiment, the error in the interpolative operation will not occur.

In the present embodiment, assuming that the frequency f2 of the word clock LRCK is 59.07 kHz, when the conversional ratio β comes to 96 kHz/59.07 kHz=1.625, the temporal density for the operation command signal CRQ generated synchronously with the main clock φm of 96 kHz is squared with the frequency f2=59.07 kHz of the word clock LRCK. The residual quantity of interpolated samples y in the FIFO 3 is confined to the appropriate range. Sampling frequency conversion is performed with the conversional ratio β set to 1.625. The interpolated samples y of 59.07 kHz resulting from the sampling frequency conversion are sent to the device in the succeeding stage via the FIFO 3 and interface 4.

In this case, since the conversional ratio β is 1.625, the phase information P gets smaller than 1. The operation command signal CRQ is generated. When the main clock φm is generated next, the phase information P is increased by β−1=0.625. Consequently, the interpolative ratio α will not be negative. Therefore, the error in an interpolative operation occurring in the basic structure will not take place.

According to the foregoing present invention, even in a situation in which the frequency f2 of the word clock LRCK fed from the device in the succeeding stage gets higher than the sampling frequency f1 for the input samples x fed from the device in the preceding device, an error in an interpolative operation will not occur but sampling frequency conversion to the frequency of the word clock LRCK can be achieved. Consequently, according to the present embodiment, even when the word clock LRCK has jitter, sampling conversion to a sampling frequency identical to the sampling frequency for input samples can be achieved without occurrence of an error in an interpolative operation. Moreover, according to the present embodiment, sampling frequency conversion to a frequency that is equal to or smaller than a double of the sampling frequency for input samples and that is higher than the sampling frequency for the input samples can be achieved.

Figure 11:
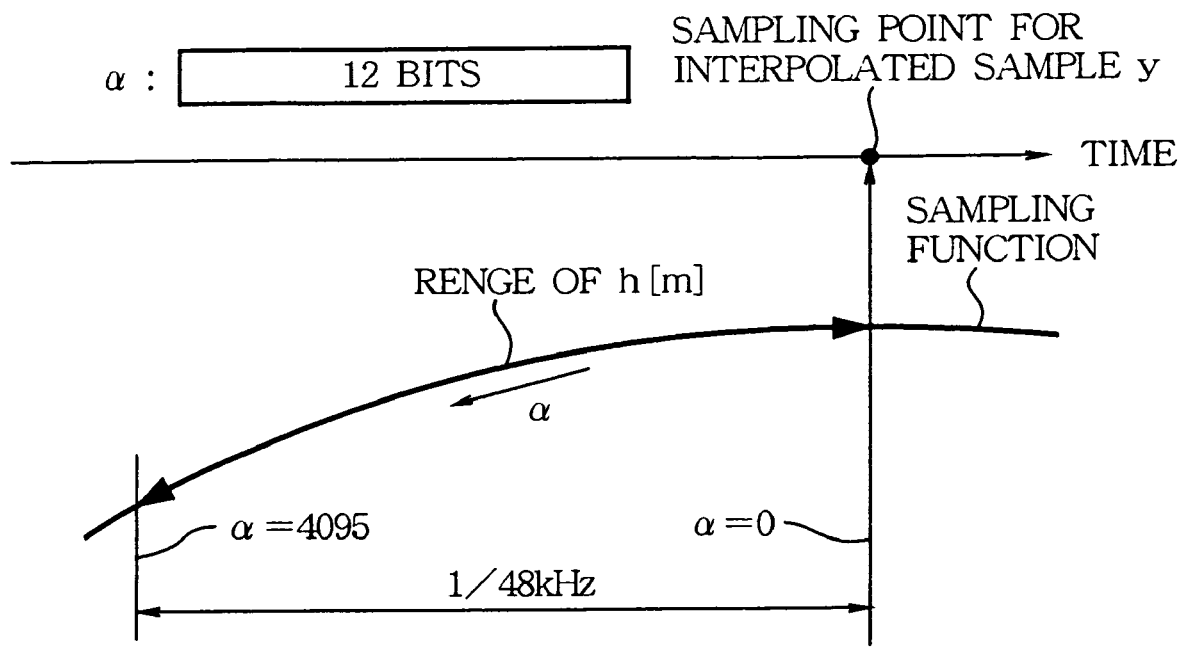
FIGS. 11($a$) and 11($b$) are a diagram for explaining the fact that a regular coefficient generation circuit can be employed in the embodiment.
Figure 11:
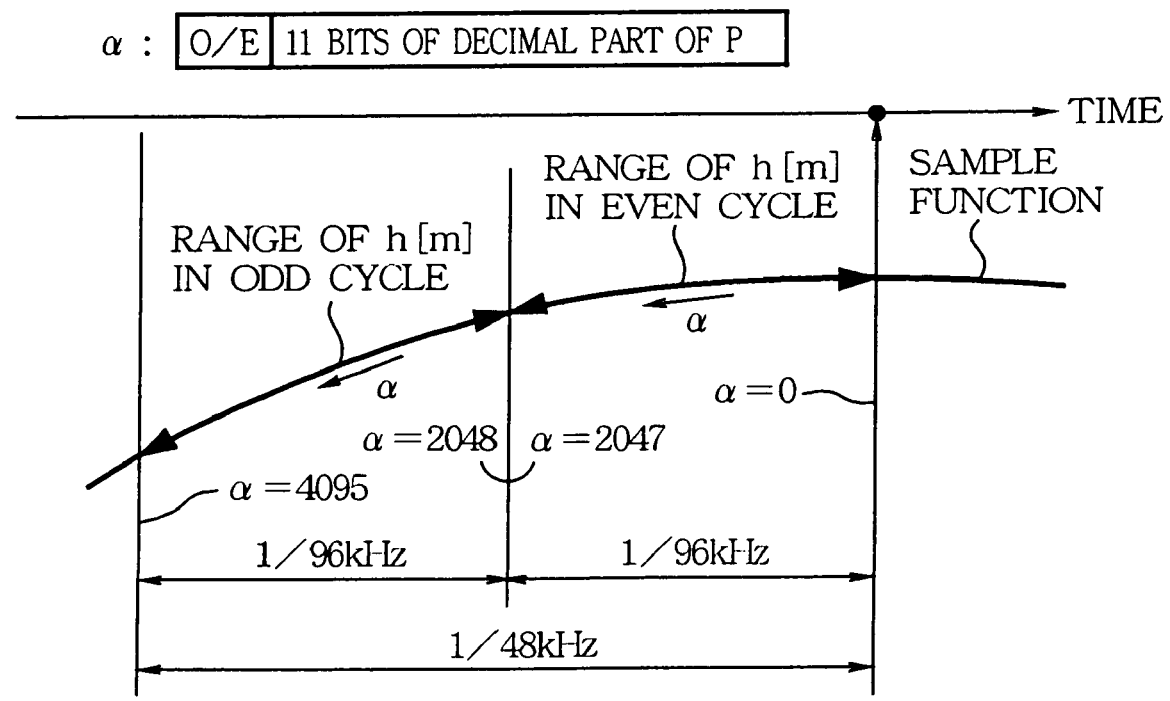

Moreover, according to the present embodiment, there is an advantage that as long as a time resolution of an interpolative operation remains unchanged, the coefficient generation circuit 202 employed in the basic sampling frequency conversion apparatus can be used as the coefficient generation circuit 202a as it is. Referring to FIG. 11, the advantage will be described below.

FIG. 11(a) shows a range of an interpolative coefficient h[m] by which a sample x[i−m] immediately preceding a sampling point for the interpolated sample y is multiplied during an interpolative operation. As shown in FIG. 11(a), function values within an interval having a time length of ⅟48 kHz on the left-hand side (negative side) of a peak point of a sampling function are generated as the interpolative coefficient h[m]. When the interpolative ratio α is 12-bit data, the coefficient generation circuit 202 generates a value, which may assume any value ranging from 0 to 4095 and which is associated with the value of the interpolative ratio α, out of function values of points into which the interval of ⅟48 kHz is divided.

FIG. 11(b) shows ranges of interpolative coefficients h[2m] and h[2m+1] by which a sample x[i−m] immediately preceding a sampling point for the interpolated sample y is multiplied during an interpolative operation.

In the present embodiment, when the sampling point for the interpolated sample y belongs to the even cycle, the even-numbered interpolative coefficient h[2m] is generated, and the sample x[i−m] is multiplied by the interpolative coefficient h[2m]. When the sampling point for the interpolated sample y belongs to the odd cycle, the odd-numbered interpolative coefficient h[2m+1] is generated, and the sample x[i−m] is multiplied by the interpolative coefficient.

However, as shown in FIG. 11(b), function values within an interval having a time length of 1/96 kHz on the left-hand side (negative side) of a peak point of a sampling function are used as the interpolative coefficient h[2m], and function values in a left adjacent interval having a time length of 1/96 kHz are used as the interpolative coefficient h[2m+1]. Consequently, the range of interpolative coefficient by which the sample x[i−m] is multiplied is the same between the present embodiment and the basic structure.

Consequently, as long as the 12-bit interpolative ratio α similar to the one in the basic structure is formed by adding the odd/even instruction signal O/E as the most significant bit to the 11-bit decimal part of the phase information P, the coefficient generation circuit 202 employed in the basic sampling frequency conversion apparatus can be used as the coefficient generation circuit 202a as it is.

An embodiment of the present invention has been described so far. For the present invention, other embodiments are conceivable. For example, there are embodiments described below.

(1) A clock φ1 to be fed to the input sample register 201 may be produced by halving the frequency of the main clock φm. When writing of the input samples x in the input sample register 201 is performed at the leading edge of the clock φ1, a period during which the clock φ1 has an H level is regarded as the even cycle of the main clock φm, and a period during which the clock φ1 has an L level is regarded as the odd cycle. The clock φ1 may be substituted for the odd/even instruction signal O/E. According to this mode, the clock counter 130 for producing the odd/even instruction signal O/E can be excluded.

(2) In the aforesaid embodiment, the interpolative ratio α that is part (a decimal part) of the phase information P is sent to the interpolation unit 2a in order to cause the interpolation unit 2a to perform an interpolative operation. When the operation command signal CRQ is generated, since an integral part of the phase information P is 0, the whole of the phase information P can be sent to the interpolation unit 2a without any problem.

(3) In the aforesaid embodiment, when the phase information P gets smaller than 1, the operation command signal CRQ is generated. When the phase information P falls below a predetermined value larger than 1, the operation command signal CRQ may be generated. Namely, when the fact that the phase relationship between the interpolative-operation input sample string and the interpolated samples y meets a predetermined condition is detected based on the phase information P, the operation command signal CRQ should be generated.

(4) In the aforesaid embodiment, the interface 4 receives the word clock LRCK having the same frequency as a sampling frequency requested by a device in a succeeding stage, and calculated interpolated samples are transmitted to the device in the succeeding stage synchronously with the word clock LRCK. Alternatively, the sampling frequency conversion apparatus may be designed so that: a sampling frequency requested by the device in the succeeding stage may be sensed through, for example, negotiation prior to the initiation of communication without reception of the word clock LRCK; and interpolated samples having the sampling frequency may be calculated using input samples x, and sent to the device in the succeeding stage.

The invention claimed is:

1. A sampling frequency conversion apparatus for applying an interpolative operation to input samples having an input sampling frequency so as to compute interpolated samples having an output sampling frequency which is specified by a succeeding device, and for outputting the interpolated samples to the succeeding device, the sampling frequency conversion apparatus comprising:

an input sample register that stores a predetermined number of input samples as an original sequence of input samples for the interpolative operation;

a coefficient generating part that prepares a first sequence of interpolative coefficients corresponding to an over-sampled sequence of input samples which are obtained by inserting nominal input samples of zero values to the input samples stored in the input sample register, and that generates a second sequence of interpolative coefficients which are extracted from the first sequence of the interpolative coefficients and which correspond to the original sequence of the input samples; and a convolutional operation part that convolutes the second sequence of the interpolative coefficients with the original sequence of the input samples so as to output the interpolated sample.

2. The sampling frequency conversion apparatus according to claim 1, (1) wherein the apparatus further comprises a control part that operates in synchronization with a main clock having a frequency twice as high as the input sampling frequency of the input samples, for updating phase information indicating a phase relation between the original sequence of the input samples and a sequence of interpolated samples to be generated, and that generates an operation command signal instructing the interpolative operation for generating the interpolated sample when the updated phase information satisfies a predetermined condition, (2) wherein the input sample register operates in synchronization with a frequency identical to the input sampling frequency of the input samples, for sequentially fetching the input samples and storing N number of newest ones of the fetched input samples as the original sequence of the input samples for the interpolative operation, (3A) wherein the apparatus further comprises an even cycle operation command register that operates in synchronization with the main clock for storing the operation command signal when the same is generated in an even cycle of the main clock, and an even cycle phase information register that stores the phase information associated with the operation command signal generated in the even cycle of the main clock, (3B) wherein the apparatus further comprises an odd cycle operation command register that operates in synchronization with the main clock for storing the operation command signal when the same is generated in an odd cycle of the main clock, and an odd cycle phase information register that stores the phase information associated with the operation command signal generated in the odd cycle of the main clock, (4A) wherein the coefficient generating part operates when the operation command signal is stored in the even cycle operation command register for performing an even interpolative coefficient generation process such as to generate the second sequence of the interpolative coefficients composed of N number of even interpolative coefficients which are extracted from the first sequence of 2N number of the interpolative coefficients which correspond to the oversampled sequence of 2N number of input samples such that the second sequence of the interpolative coefficients has the phase relation relative to the original sequence of the input samples as indicated by the phase information stored in the even cycle phase information register, (4B) wherein the coefficient generating part operates when the operation command signal is stored in the odd cycle operation command register for performing an odd interpolative coefficient generation process such as to generate the second sequence of the interpolative coefficients composed of N number of odd interpolative coefficients which are extracted from the first sequence of 2N number of the interpolative coefficients corresponding to the oversampled sequence of 2N number of input samples such that the second sequence of the interpolative coefficients has the phase relation relative to the original sequence of the input samples as indicated by the phase information stored in the odd cycle phase information register, (4C) wherein the coefficient generating part operates when the operation command signal is stored in both the even cycle operation command register and the odd cycle operation command register for performing both the even interpolative coefficient generation process and the odd interpolative coefficient generation process, and (5) wherein the convolutional operation part operates each time the second sequence of the N number of the interpolative coefficients are generated by the coefficient generating part for performing a convolutional operation of the second sequence of N number of the coefficients and the original sequence of the N number of the input samples to output the interpolated sample.

3. The sampling frequency conversion apparatus according to claim 2, wherein the apparatus further comprises an interface that receives a word clock having the same frequency as the output sampling frequency specified by the succeeding device, and transmits the interpolated samples successively fed from the convolutional operation part to the succeeding device in synchronization with the word clock, and wherein the control part controls an interval of the operation command signals which are successively generated each time the updated phase information satisfies the predetermined condition so as to allow the interval of the operation command signals to follow the frequency of the word clock.

4. The sampling frequency conversion apparatus according to claim 3, wherein the apparatus further comprises a first-in first-out buffer that sequentially stores the interpolated samples outputted from the convolutional operation part, and sequentially reads and outputs the interpolated samples from the old ones stored in the first-in first-out buffer in response to the word clock, and wherein the control part includes a residual quantity detecting part for detecting a residual quantity of the interpolated samples that have not been read from the first-in first-out buffer, and controls on the basis of the residual quantity detected by the residual quantity detecting part so as to allow the interval of the operation command signals to follow the frequency of the word clock.

5. The sampling frequency conversion apparatus according to claim 1, wherein the coefficient generating part prepares the first sequence of the interpolative coefficients corresponding to the oversampled sequence of input samples which are obtained by inserting nominal input samples of zero values to the input samples stored in the input sample register so that the oversampled sequence of the input samples has an oversampling frequency twice as high of the input sampling frequency, such that each cycle of the input sampling frequency is divided into an even cycle and an odd cycle in correspondence to each cycle of the oversampling frequency, and such that the first sequence of the interpolative coefficients contains even interpolative coefficients and odd interpolative coefficients corresponding to even cycles and odd cycles of the oversampling frequency, wherein the coefficient generating part operates at an even cycle for generating the second sequence of the even interpolative coefficients which are extracted from the first sequence of the interpolative coefficients, and operates at an odd cycle for generating the second sequence of the odd interpolative coefficients which are extracted from the first sequence of the interpolative coefficients, and wherein the convolutional operation part operates at the even cycle for convoluting the second sequence of the even interpolative coefficients with the original sequence of the input samples so as to output the interpolated sample, and operates at the odd cycle for convoluting the second sequence of the odd interpolative coefficients with the original sequence of the input samples so as to output the interpolated sample.

6. The sampling frequency conversion apparatus according to claim 5, wherein the coefficient generating part prepares the first sequence of the interpolative coefficients which are twice as many as the number of input samples contained in the original sequence of the input samples stored in the input sample register.

* * * * *